US008924834B2

(12) United States Patent
Draper et al.

(10) Patent No.: US 8,924,834 B2
(45) Date of Patent: Dec. 30, 2014

(54) ERROR CORRECTION CIRCUIT FOR DATA COMMUNICATION PROVIDING PARALLELIZABLE LINEAR PROGRAMMING DECODING

(71) Applicants: Stark Draper, Madison, WI (US); Benjamin Recht, Madison, WI (US); Siddharth Barman, Pasadena, CA (US)

(72) Inventors: Stark Draper, Madison, WI (US); Benjamin Recht, Madison, WI (US); Siddharth Barman, Pasadena, CA (US)

(73) Assignee: Wisconsin Alumni Research Foundation, Madison, WI (US)

( * ) Notice: Subject to any disclaimer, the term of this patent is extended or adjusted under 35 U.S.C. 154(b) by 163 days.

(21) Appl. No.: 13/627,686

(22) Filed: Sep. 26, 2012

(65) Prior Publication Data

US 2014/0089759 A1    Mar. 27, 2014

(51) Int. Cl.
| | | |
|---|---|---|
| *H03M 13/00* | (2006.01) | |
| *G11C 29/00* | (2006.01) | |
| *G06F 11/10* | (2006.01) | |

(52) U.S. Cl.
CPC ......... *H03M 13/6393* (2013.01); *G06F 11/104* (2013.01)
USPC .......................................... 714/801; 714/766

(58) Field of Classification Search
None
See application file for complete search history.

(56) References Cited

U.S. PATENT DOCUMENTS

| | | | | |
|---|---|---|---|---|
| 7,752,649 | B1 * | 7/2010 | Harvey et al. | 725/139 |
| 7,757,150 | B2 * | 7/2010 | Stolpman | 714/752 |
| 7,856,584 | B2 * | 12/2010 | Ovchinnikov et al. | 714/752 |
| 7,865,807 | B2 * | 1/2011 | Lablans | 714/781 |
| 7,926,084 | B1 * | 4/2011 | Harvey et al. | 725/139 |
| 8,082,478 | B2 * | 12/2011 | Lunglmayr et al. | 714/748 |
| 8,495,458 | B1 * | 7/2013 | Song et al. | 714/758 |
| 2004/0268205 | A1 * | 12/2004 | Stolpman | 714/758 |
| 2007/0113163 | A1 * | 5/2007 | Golitschek Edler Von Elbwart et al. | 714/801 |
| 2007/0283227 | A1 * | 12/2007 | Sharon et al. | 714/776 |
| 2008/0010581 | A1 * | 1/2008 | Alrod et al. | 714/763 |
| 2008/0016433 | A1 * | 1/2008 | Stolpman | 714/786 |
| 2008/0316069 | A1 * | 12/2008 | Draper et al. | 341/51 |
| 2009/0158114 | A1 * | 6/2009 | Shokrollahi | 714/752 |
| 2009/0319861 | A1 * | 12/2009 | Sharon et al. | 714/752 |
| 2010/0287436 | A1 * | 11/2010 | Lastras-Montano et al. | 714/752 |
| 2011/0258510 | A1 * | 10/2011 | Watson et al. | 714/752 |

OTHER PUBLICATIONS

Jon Feldman, Martin J. Wainwright, David R. Karger; Using Linear Programming to Decode Binary Linear Codes; IEEE Transactions on Information Theory, vol. 51, No. 3, Mar. 2005, pp. 954-972.

* cited by examiner

*Primary Examiner* — Daniel McMahon
(74) *Attorney, Agent, or Firm* — Boyle Fredrickson, S.C.

(57) ABSTRACT

An error detection/correction system provides an electronic circuit detecting and correcting transmission errors using linear programming. Linear programming techniques are made practical for real-time error correction and decoding by dividing the linear programming problem into independent parallelizable problems so that separate independent portions of the electronic circuit may simultaneously address solutions related to individual bits and/or parity rules.

18 Claims, 5 Drawing Sheets

ERROR CORRECTION CIRCUIT FOR DATA COMMUNICATION PROVIDING PARALLELIZABLE LINEAR PROGRAMMING DECODING

BACKGROUND OF THE INVENTION

The present invention relates to error correction circuits for detecting and correcting errors in transmitted or stored digital data and in particular to an error correction circuit providing high-speed linear programming detection and error correction.

The reliable transmission and storage of digital data, for example binary symbols transmitted as electrical impulses over data communication networks or stored on digital storage media, may employ error detection and/or correction circuitry and protocols to guard the transmitted or stored data against corruption.

Generally, error detection and correction is obtained by providing redundant bits in the transmitted or stored data. A naïve redundancy scheme may simply duplicate the transmission or storage of the data; however, sophisticated redundancy systems provide a limited number of detection and correction bits (henceforth "check bits") each of which serve to detect and/or correct errors in multiple other data bits. For example, an 8-bit message might have a single ninth check bit termed a parity bit. This parity bit is set or reset so as to make the total number of set bits in the message and parity bit an even number. It will be understood that corruption of any one of the message or parity bits caused by a crossover (i.e. changing of the bits during transmission or during storage) will be readily detected by checking whether the total number of bits set is even. If not, an error in transmission or storage can be assumed.

More generally, multiple check bits can be added to any stored or transmitted data word allowing both detection and correction of errors in the message bits. These extra bits increase the numeric spacing or Hamming distance between legitimate message symbols represented by the data and check bits taken together. Errors are detected if the received symbol is positioned between legitimate symbols and error correction is obtained by choosing the closest legitimate symbol. In this respect it will be understood that error correction simply chooses the most likely correct symbol.

Sophisticated error detection and correction systems may employ "low density parity check codes" in which overlapping subsets of data bits and check bits are subject to independent constraints (e.g. even parity), the constraints thus each applying to only a small subset of the bits. Low-density parity check codes allow transmission of data very close to the Shannon limit that relates the amount of information that can be transmitted over a channel of a given bandwidth in the presence of given noise interference.

Decoding information that has been encoded using low density parity check codes is computationally demanding, involving the determination of a most likely transmitted string in the face of errors and subject to the overlapping constraints of the originally transmitted message. One method of performing this decoding, termed "belief propagation", iteratively communicates values of the received bits in each subset (as maintained in a buffer) to a circuit that applies attempts to reconcile the received values according to their constraint parity and retransmit updated reconciled values to the buffer. Each bit of the buffer receives updates from multiple reconciling circuits and a mechanism is provided to integrate the different and often conflicting updates. This cycle is performed iteratively.

Belief propagation is parallelizable to the extent that the calculations associated with each reconciliation step and each integration step may be implemented simultaneously and independently by separate computing elements. This is important for high-speed message processing.

Unfortunately, although belief propagation is often empirically successful, there is no guarantee that it will converge to a set of bits that meets the constraint of the parity rules. Further, belief propagation is subject to an "error floor" representing a limit to its ability to detect and correct errors.

SUMMARY OF THE INVENTION

The present invention provides a decoder for low density parity check codes and other similar coding systems that both demonstrably converges and may be parallelized for execution of different portions of the decoding simultaneously for high-speed processing.

Specifically, the present invention provides an error correction circuit including a buffer memory for holding a received string of bits derived from a transmitted string of bits, the latter subject to a probability of transmission error. "Transmitted" shall be understood in this context to include the process of data storage as well as the process of data transmission. A parity rule memory holds a set of parity rules for the transmitted string of bits, each parity rule describing a predefined intended relationship between a subset of the bits as originally transmitted. The buffer memory and parity rule memory communicate with a linear programming optimizer, the latter which generates a corrected string of bits from the received string of bits using a linear programming process configured to maximize a probability that the corrected string of bits represents the transmitted string of bits, subject to the parity rules for the bits.

It is thus a feature of at least one embodiment of the invention to provide a robust error correction and detection decoding that can be proven to converge. Current belief propagation is not subject to this rigorous understanding. It is further a feature of at least one embodiment of the invention to provide an error correction and detection system that does not appear to be subject to an error floor, making it suitable for extremely high reliability error detection and correction.

The linear programming optimizer may iteratively repeat two steps, a first step adjusting values of the corrected string of bits based on iteratively changing replica parity subvectors (henceforth "replicas") and a second step updating the iteratively changing replicas based upon their deviation from the actual parity rules.

It is thus a feature of at least one embodiment of the invention to provide a decoding system that reduces data flow paths by modification of replicas, thus offering potential for simpler hardware implementation.

The first step of adjusting values of the corrected string of bits may adjust each bit of the corrected string of bits as a function of the iteratively changing replicas independent of the value of the other bits of the corrected string of bits.

It is thus a feature of at least one embodiment of the invention to permit parallel processing of the modifications of the replicas for improved scalability with long data words and improved execution speed.

The electronic circuit may provide independently executing multiple computational elements associated with different replicas to substantially simultaneously adjust the different replicas It is thus a feature of at least one embodiment of the invention to provide a circuit exploiting the parallelism of the replica iterations.

The electronic circuit may provide multiple independently executing computational elements associated with different values of the corrected string of bits to substantially simultaneously adjust the different values of the corrected string of bits.

It is thus a feature of at least one embodiment of the invention to provide a circuit exploiting the parallelism of the correction of the received string of bits.

The second step of updating the iteratively changing replicas may define a projection of the iteratively changing replicas to a parity polytope being a convex hull whose vertices are defined by the parity rules.

It is thus a feature of at least one embodiment of the invention to provide a mechanism for efficiently projecting solutions to the parity polytope, the latter representing a relaxation to the decoding process permitting linear programming to be applied.

The first and second steps may implement an alternating direction method of multipliers.

It is thus a feature of at least one embodiment of the invention to exploit a robust and well-understood mathematical technique in a novel way to provide parallelism in the linear programming solution to error detection and correction.

The maximized probability may model a binary symmetric channel.

It is thus a feature of at least one embodiment of the invention to provide a simple and widely applicable model for the transmission link.

The parity rules may provide a low-density parity check taking as arguments less than 20 percent of the bits of the transmitted string of bits. Alternatively or in addition, the parity rules may provide for even parity for a subset of bits of the transmitted string of bits.

It is thus a feature of at least one embodiment of the invention to provide a system suitable for a common class of error correction protocols.

These particular features and advantages may apply to only some embodiments falling within the claims and thus do not define the scope of the invention.

DETAILED DESCRIPTION OF THE PREFERRED EMBODIMENT

Figure 1:
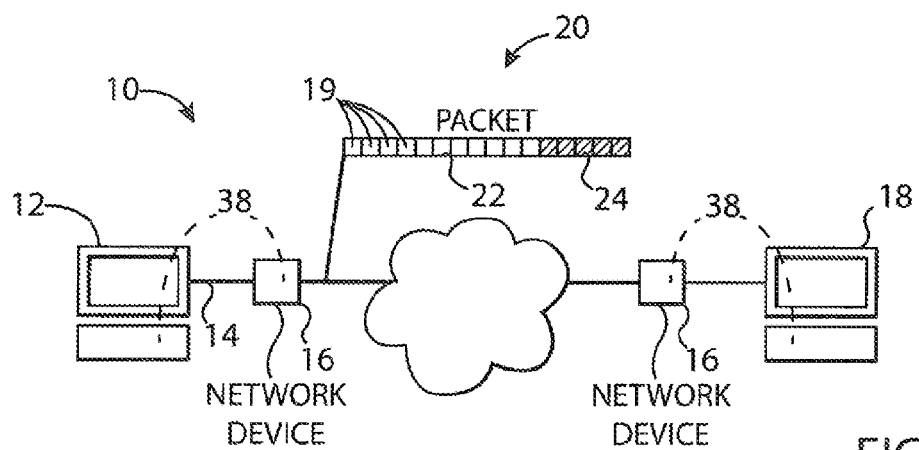
FIG. 1 is a simplified block diagram of a first application of the present invention involving data communication of binary data over a noisy channel as may incorporate an error decoder of the present invention in different inter-communicating components.

Referring now to FIG. 1, a data communication system 10 may provide for a first terminal device 12, for example a computer terminal or server, communicating with network media 14, for example, the latter being copper conductors, optical media, or radio communication or the like. The network media 14 communicates through one or more network devices 16, such as routers or other switches, with a second terminal device 18 similar to the first terminal device 12.

Data communicated on the data communication system 10 may comprise data composed of string of binary bits, termed a "packet" 20, including a content portion 22 and error correcting portion 24 which may be segregated as shown or interleaved arbitrarily. The error correcting portion 24 provides message redundancy to improve one or both of error detection and error correction in the event that bits of the packet 20 are corrupted or flipped, being generally changing a bit value from 1 to 0 or 0 to 1.

Figure 2:
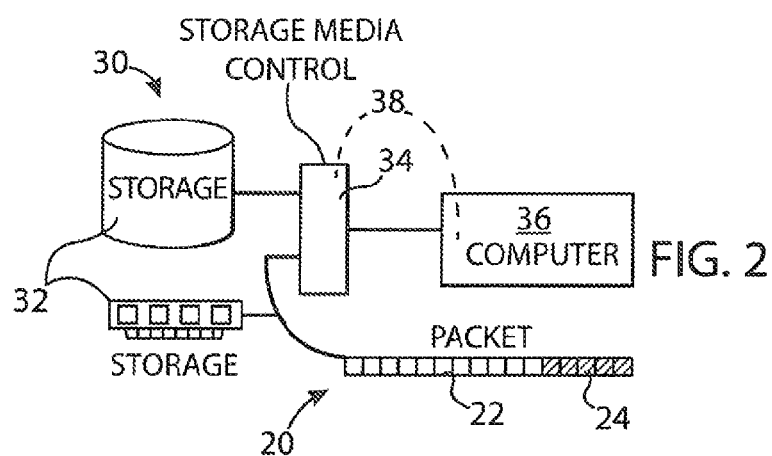
FIG. 2 is a simplified block diagram a second application of the present invention involving a data storage system that may incorporate the error decoder of the present invention in the different inter-communicating components.

Referring now also to FIG. 2, alternatively, a data storage system 30 may provide for data storage media 32, for example, including disk drives or solid-state memory or the like that may hold stored data words. The stored data words also comprise a packet 20 having a content portion 22 and an error-correcting portion 24 as described above. The packet 20 may be communicated to a storage media control device 34 and then to a computer 36 using data of the packet 20. For convenience of explanation, the data transmitted or stored in these examples will be henceforth termed "transmitted data".

The present invention provides an error decoder circuit 38 that may be located to receive the packet 20 after transmission at any of the devices 12, 16, 34 and 36, and as so located operate to detect any errors caused by transmission or storage of the packet 20 and, to the extent possible, correct those errors based on an analysis of the transmitted bits of the content portion 22 and the error correcting portion 24.

Figure 3:
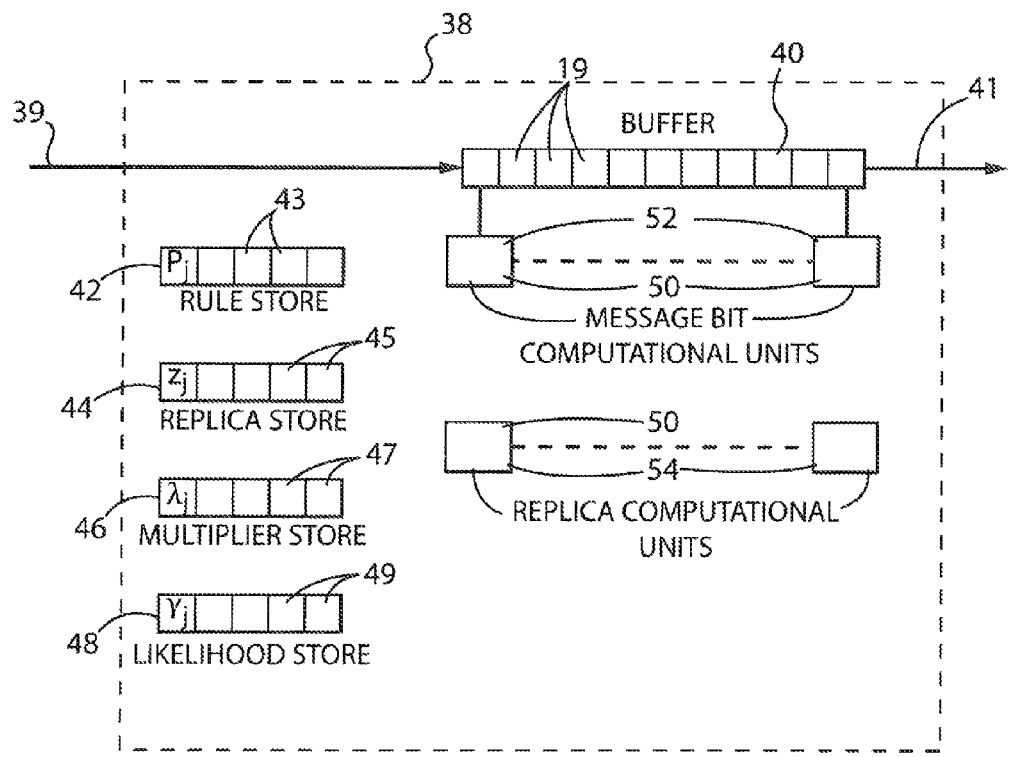
FIG. 3 is a function diagram of a circuit constructed according to the present invention as may receive a binary string of data for detecting and correcting errors according to predetermined stored parity rules.

Referring now to FIG. 3, the error decoder circuit 38 may include a set of memory structures for storing and accessing of digital data including: a packet buffer 40 for storing the bits 19 of the packet 20 (the bits 19 herein designated $x_i$ where i is an index for the bit number), a parity rule store 42 for storing parity rules 43 (each parity rule 43 herein designated as $\kappa_j$), a replica store 44 for storing replicas 45 (each replica 45 herein designated $z_j$, where j is an index for the number of different parity rules), a Lagrangian multiplier store 46 for storing Lagrangian multiplier values 47 (each multiplier designated $\lambda_j$), and a likelihood store 48 storing likelihood values 49 (each likelihood value 49 herein designated $\gamma_i$). Each of these will be discussed in greater detail below.

Generally, each bit 19 will have one of two states generally referred to as zero or one, each parity rule 43 will be represented by a matrix, each replica 45 as a vector and each Lagrangian multiplier value 47 and each likelihood value 49 will be represented as a binary word of predetermined length. The error decoder circuit 38 will generally receive, through an input channel 39, packets 20 transmitted from another device and, using a process that will be described below and with access to other data of the memory structures 42, 44, 46, and 48, will detect errors in the received packet 41 for later use by downstream device.

The error decoder circuit 38 may also provide multiple computational units 50 each being, for example, a limited instruction set processor or discrete processing circuitry including but not limited to a gate array or the like. These computational units 50 may execute substantially independently and simultaneously according to a stored program, implemented in software, firmware or as is implicit in the circuit organization and connection, to read and write to each of the memory structures 40, 42, 44, 46, and 48 to permit parallel execution of the error correcting process as will be described. Generally an arbitrary number of computational units 50 may be used and allocated appropriately.

In the embodiment discussed herein, the computational units 50 may include message bit computational units 52 and replica computational units 54. The message bit computational units 52 may be provided in number equal to the number of bits in the binary packet 20 (and hence the number of bits i in the buffer 40) and replica computational units 54 may be provided equal in number to the number j of the replicas 45 of the replica store 44. The invention is not limited to this particular embodiment and it will be understood from the discussion below that the staging of the processing of data by the error decoder circuit 38 may permit a sharing of functions between the message bit computational units 52 and the replica computational units 54 when those computational units are general-purpose processors and that some sequential processing may be permitted with a concomitant loss in speed.

Figure 4:
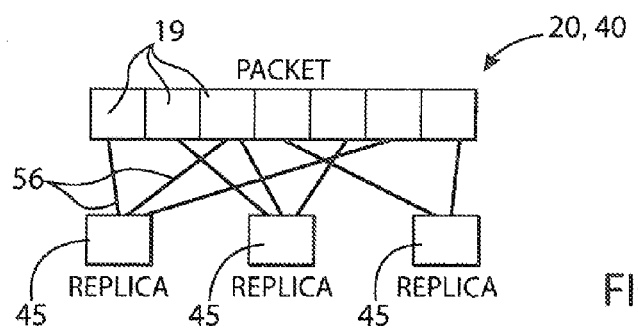
FIG. 4 is a simplified factor graph showing a relationship between parity rules and bits of the received binary string according to one protocol executable by the present invention.

Referring now to FIGS. 3 and 4, each of the parity rules 43 may be associated with a particular subset of the bits 19 received in the buffer 40 as indicated by connecting lines 56 to implement a parity check only on the connected bits 19 of that subset. In one embodiment, the parity rules 43 (and, as will be discussed below, the replica 45) may be associated with a relatively small number of the total bits 19 of the packet 20 (for example, in the classic "(3,6) regular" family of low-density parity-check code introduced by Robert Gallager in his 1962 PhD thesis each parity rule is associated with 6 bits, even if the code length is in the thousands) and thus represent a low density parity check. The parity check may, for example, enforce an even parity on the associated bits 19 of the subset indicating that the number of one bits must be even if the bits 19 of the subset were transmitted without error. The invention may nevertheless be useful for high-density parity checks and other constraints between bits 19 of packet 20 implemented by objective rules of a type similar to the parity checks described.

In the example of FIG. 4, the second replica 45 may look at the second, third and fifth bits 19 to ensure that there is even parity. In this example, each of these bits 19 may be the one violating the even parity constraint of the replica 45. An error in the transmission of the packet 20 is thereby indicated, and the invention, as will be described below, accordingly operates next to determine, to the extent possible, a corrected set of bits 19 that has a maximum likelihood of representing the packet 20 as originally transmitted. Generally this process will attempt to reconcile each of the rules implemented by different replicas 45 operating on overlapping subsets of the bits 19 and the present invention performs this reconciliation by casting the reconciliation as a linear programming problem.

Linear programming will be understood to be a mathematical technique for problems that can be expressed as maximization (or minimization) of a vector of variables subject to a constraint which defines a convex polytope over which the function must be maximized (or minimized). In this case the linear programming problem may be expressed as:

$$\text{minimize} \sum_i \gamma_i x_i \quad (1)$$

subject to each $x_i$ meeting the parity rules
where $\gamma_i$ is a negative log likelihood ratio defined as:

$$\gamma_i = \log\left(\frac{p(\tilde{x}_i \mid 0)}{p(\tilde{x}_i \mid i)}\right) \quad (2)$$

and where the numerator and denominator express the probability that $\tilde{x}$ received given that the value to the right of the vertical line was transmitted. This definition assumes a binary symmetric transmission channel where the bits are equally likely to flip from 0 to 1 as from 1 to 0. A more complete explanation of this formulation is provided in the attached Appendix.

Figure 5:
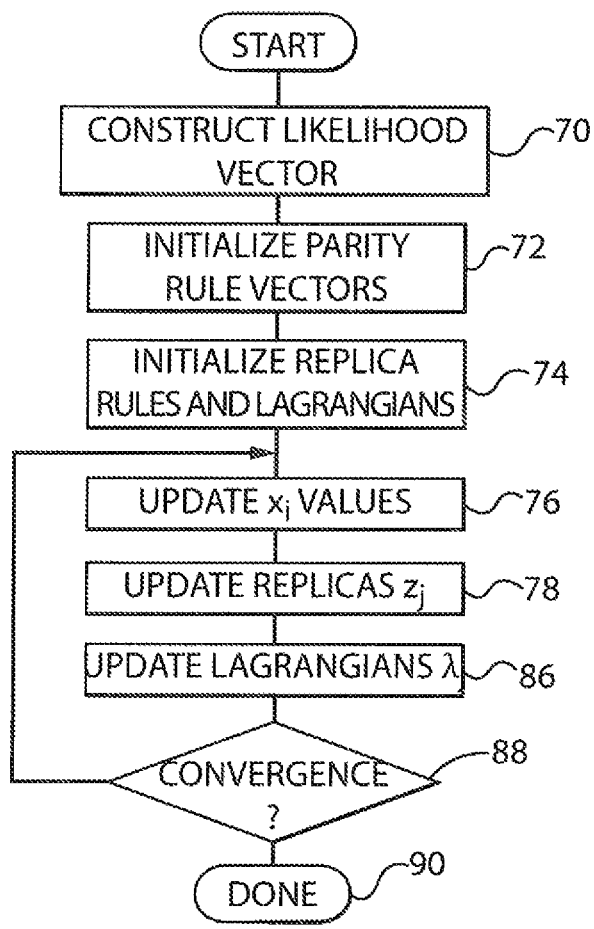
FIG. 5 is a flowchart of the principal steps of the iterative decoding process of the present invention.
Figure 6:
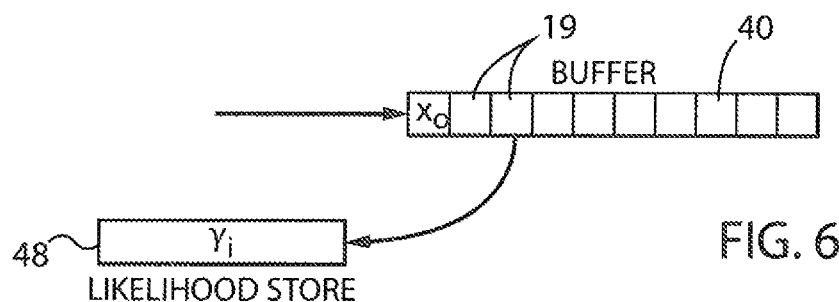
FIG. 6 is a fragmentary representation of FIG. 3 showing data flow during initialization steps of the decoding process.

Referring now to FIG. 5 and FIG. 6, in a first step of the error detecting and correcting process implemented by the computational units 50 according to their stored programs, a likelihood vector is generated, as indicated by process block 70, and used to populate the likelihood store 48. This initialization may be chosen arbitrarily but may, for example, initialize each value γi to one when its corresponding bit xi in the received packet 20 is zero and vice versa, reflecting the definition of γi. In this process the value of $\gamma_i$ is generated for each value of $x_i$.

As indicated by process block 72, the parity rule store 42 next may be loaded with the known parity rules for the communication system and, at process block 74, the replica store 44 may be initialized to match the parity rules 43 of the parity rule store 42. Finally the Lagrangian multiplier store 46 may be initialized, for example, to all zero values.

Figure 7:
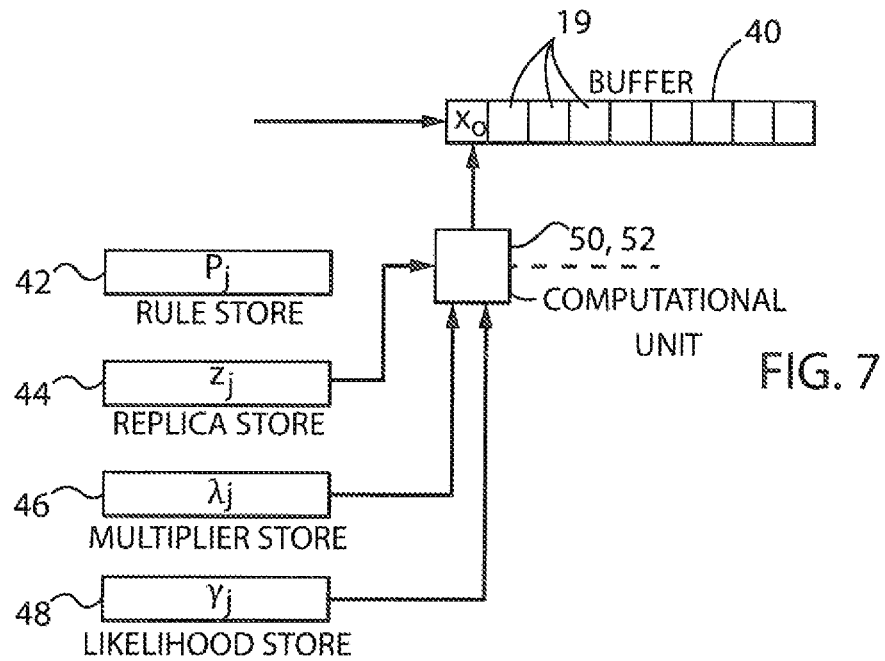
FIG. 7 is a fragmentary representation of FIG. 3 showing data flow during an updating of the bit string in a first step of an iterative decoding process.

Referring now to FIGS. 5 and 7, the computational units 50 then loop through the following three steps. At a first step indicated by process block 76, each of the values of $x_i$ of the byte packet 20 are updated using the mechanism of alternating direction method of multipliers (ADMM) according to the current values of the replica 45 in replica store 44, the current values of the Lagrangian multiplier store 46 and the current values of the likelihood store 48 according to the following equation:

$$x_i = \prod_{[0,1]} \left( \frac{1}{|N_v(i)|} \left( \sum_{j \in N_v(i)} \left( z_j^{(i)} - \frac{1}{\mu} \lambda_j^{(i)} \right) - \frac{1}{\mu} \gamma_i \right) \right) \quad (3)$$

The terms of this equation are more fully defined and developed in the attached Appendix.

The above first step which updates the values of the bits 19 is limited to changing the bits 19 to values between zero and one. This process may be performed in parallel by multiple message bit computational units 52 each operating on a different bit 19 simultaneously for multiple or all bits 19.

Figure 8:
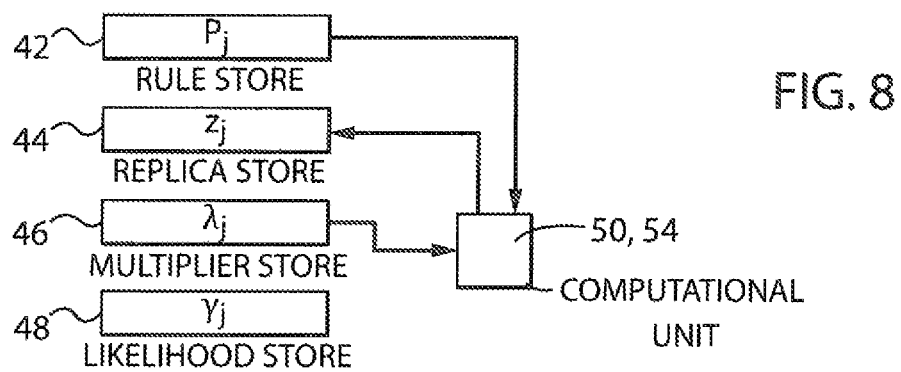
FIG. 8 is a fragmentary representation of FIG. 3 showing data flow during an updating of replica for a second step of the iterative decoding process.

Referring now to FIGS. 5, 6 and 8, at a second step per process block 78, the values of the replica store 44 are updated based on the current parity rules 43 and the Lagrangian multiplier value 47 in a first update substep creating intermediate vectors vj according to the following equation:

$$v_i = P_j x + \frac{\lambda_j}{\mu} \quad (4)$$

In a second substep, the vector vj is then projected onto a closest surface of the convex hull (parity polytope) whose vertices are defined by the parity rules 43.

Figure 10:
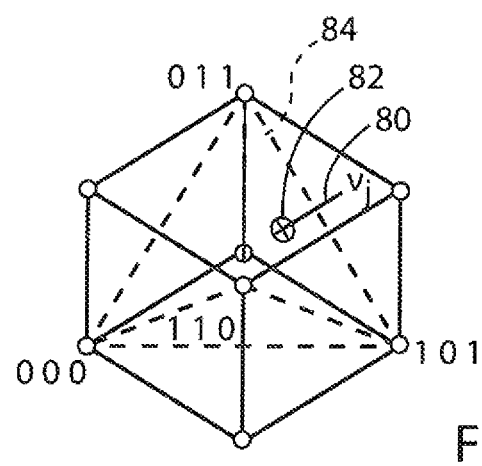
FIG. 10 is a representation of a simplified polytope showing a projection process used in iterative adjustment of the replica in the present invention.

Referring momentarily also to FIG. 10, in the present example of parity rules having even parity, the convex hull will be the surface defined by vertices of even parity (even Hamming weight). A simplified example of this projection may be provided with respect to a vector vj of length three wherein the parity polytope has vertices aligned with vertices (000), (011), (101) and (110) of a cube representing the even parity solutions for a vector of length three. The projection 80 finds the closest point 82 on the surface of the convex hull 84 defined by these vertices. An efficient method for computing this projection is described in the attached appendix.

The coordinates of the point 82 of the projection define the new replica vector $z_j$. This updating of the replica vector $z_j$ for each of the replica vectors j may also be accomplished in parallel by multiple replica computational units 54 which do not require the solutions to the other updated replica vectors $z_j$ to complete their updating.

Figure 9:
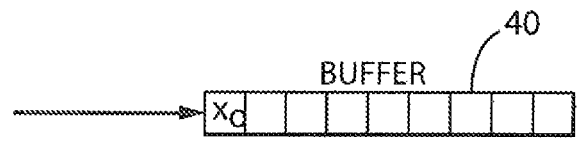
FIG. 9 is a fragmentary representation of FIG. 3 showing data flow during an updating of a Lagrangian multiplier value used in the iterative decoding process.
Figure 9:
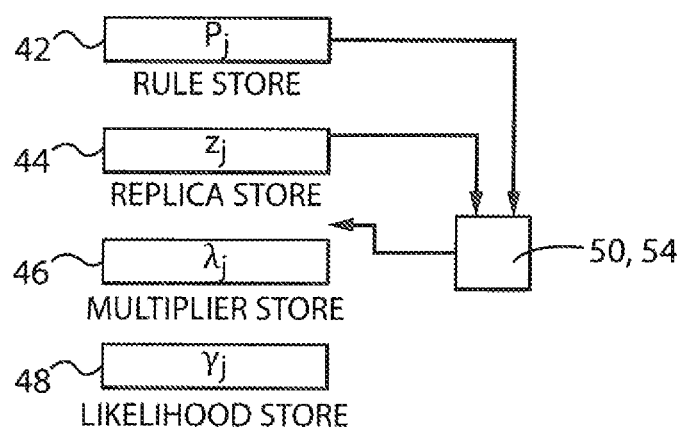

Referring now to FIGS. 5 and 9, in a third subset indicated by process block 86, the Lagrangian multipliers are then updated according to the equation:

$$\lambda_j = \lambda_j + \mu(P_j x - z_j). \quad (5)$$

Again, this process may be executed in parallel by multiple replica computational units 54.

At decision block 88, convergences are checked by determining whether the greatest difference between a parity rule 43 and its replica 45 (among all the parity rules) is less than the predetermined value according to the inequality:

$$\max_j \|P_j x - z_j\|_\infty < \varepsilon. \quad (6)$$

If this condition is satisfied, the current values of $x_i$ are returned as a solution to the correction problem as indicated by process block 90. Otherwise an additional iterated loop is performed beginning again at process block 76.

The applicants believe that the solution provided by this linear programming technique avoids the error floor inherent in belief propagation techniques. Accordingly the present invention both provides certainty of convergence and may present a preferred decoding technique for high reliability applications where frame error rates (also known as word error rates) of $10^{-10}$ or lower are required. Linear programming decoders do not display error floors.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "an electronic circuit", "a controller", a "computer" and "a processor" and the like can be understood to include one or more circuits, controllers, computers or processors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network. Similarly the term program or the like may refer to conventional computer programming in programming languages stored in memory or implicit programming contained in the interconnection of electronic devices, for example, with programmable field gate arrays. The term electronic circuit should be broadly construed to cover programmable and other circuits including computers, field programmable gate arrays, as well as application-specific integrated circuits and should generally include circuits including both optical and electronic features used for implementing circuit type functions.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

APPENDIX

In this paper we consider a binary linear LDPC code $\mathcal{C}$ of length N defined by a M×N parity-check matrix H. Each of the M parity checks, indexed by $\mathcal{J} = \{1, 2, \ldots, M\}$, corresponds to a row in the parity check matrix H. Codeword symbols are indexed by the set $\mathcal{I} = \{1, 2, \ldots, N\}$. The neighborhood of a check j, denoted by $\mathcal{N}(j)$, is the set of indices $i \in \mathcal{I}$ that participate in the jth parity check, i.e., $\mathcal{N}_c(j) = \{i | H_{j,i} = 1\}$. Similarly for a component $i \in \mathcal{I}$, $\mathcal{N}_v(i) = \{j | H_{j,i} = 1\}$. Given a vector $\chi \in \{0,1\}^N$, the jth parity-check is said to be satisfied if $\Sigma_{i \in \mathcal{N}_c(j)} \chi_i$ is even. In other words, the set of values assigned to the $\chi_i$ for $i \in \mathcal{N}_c(j)$ have even parity. We say that a length-n binary vector $\chi$ is a codeword, $\chi \in \mathcal{C}$, if and only if (iff) all parity checks are satisfied. In a regular LDPC code there is a fixed constant d, such that for all checks $j \in \mathcal{J}$, $|\mathcal{N}_c(j)| = d$. Also for all components $i \in \mathcal{I}$, $|\mathcal{N}_v(i)|$ is a fixed constant. For simplicity of exposition we focus our discussion on regular LDPC codes. Our techniques and results extend immediately to general LDPC codes and to high density parity check codes as well.

To denote compactly the subset of coordinates of $\chi$ that participate in the jth check we introduce the matrix $P_j$. The matrix $P_j$ is the binary d×N matrix that selects out the d components of $\chi$ that participate in the $j$th check. For example, say the neighborhood of the jth check, $\mathcal{N}_c(j) = \{i_1, i_2, \ldots i_d\}$, where $i_1 < i_2 < \ldots < i_d$. Then, for all $k \in [d]$ the $(k, i_k)$th entry of $P_j$ is one and the remaining entries are zero. For any codeword $\chi \in \mathcal{C}$ and for any j, $P_j \chi$ is an even parity vector of dimension d. In other words we say that $P_j \chi \in \mathbb{P}_d$ for all $j \in \mathcal{J}$ (a "local codeword" constraint) where $\mathbb{P}_d$ is defined as $$\mathbb{P}_d = \{e \in \{0,1\}^d | \|e\|_1 \text{ is even}\}. \quad (1)$$

Thus, $\mathbb{P}_d$ is the set of codewords (the codebook) of the length-d single parity-check code.

We begin by describing maximum likelihood (ML) decoding and the LP relaxation proposed by Feldman et al. Say vector $\tilde{\chi}$ is received over a discrete memoryless channel described by channel law (conditional probability) $W: \mathcal{X} \times \tilde{\mathcal{X}} \to \mathbb{R}_{\geq 0}$, $\mathbb{R}=1$ for all $\chi \in \Sigma_{\tilde{x} \in \tilde{\mathcal{X}}} W(\tilde{x}|x) = 1$ for all $\mathcal{X} \in \mathcal{X}$. Since the development is for binary codes $|\tilde{\mathcal{X}}|=2$. There is no restriction on $\tilde{x}$. Maximum likelihood decoding selects a codeword $\chi \in \mathcal{C}$ that maximizes $p_{\tilde{x}|x}(\tilde{x}|x)$, the probability that was received given that $\chi$ was sent. For discrete memoryless channel W, $p_{\tilde{x}|x}(\tilde{x}|x) = \prod_{i \in \Sigma_{\tilde{x} \in \tilde{x}} W(\tilde{x}|x)} W(\tilde{\chi}_i|\chi_i)$. Equivalently, we select a codeword that maximizes $\Sigma_{i \in \Sigma_{\tilde{x} \in \tilde{x}} W(\tilde{x}|x)} \log W(\tilde{x}_i|x_i)$. Let $\gamma_i$ be the negative log-likelihood ratio, $\gamma_i = \log [W(\tilde{\chi}_i|0)/W(\tilde{\chi}_i|1)]$. Since $\log W(\tilde{\chi}_i|\chi_i) = -\gamma_i \chi_i + \log W(\tilde{x}_i|0)$, ML decoding reduces to determining an $\chi \in \mathcal{C}$ that minimizes $\gamma^T \chi = \Sigma_{i \in \Sigma_{\tilde{x} \in \tilde{x}} W(\tilde{x}|x)} \gamma_i \chi_i$. Thus, ML decoding requires minimizing a linear function over the set of codewords.

Feldman et al. [3] show that ML decoding is equivalent to minimizing a linear cost over the convex hull of all codewords. In other words, minimize $\gamma^T \chi$ subject to $\chi \in \text{conv}(\mathcal{C})$. The feasible region of this program is termed the "codeword" polytope. However, this polytope cannot be described tractably. Feldman's approach is first to relax each local codeword constraint $P_j \chi \in \mathbb{P}_d$ to $P_j \chi \in \mathbb{PP}_d$ where $$\mathbb{PP}_d = \text{conv}(\mathbb{P}_d) = \text{conv}(\{e \in \{0,1\}^d | \|e\|_1 \text{ is even}\}). \quad (2)$$

The object $\mathbb{PP}_d$ is called the "parity polytope". It is the codeword polytope of the single parity-check code (of dimension d). Thus, for any codeword $\chi \in \mathcal{C}$, $P_j \chi$ is a vertex of $\mathbb{PP}_d$ for all j. When the constraints $P_j \chi \in \mathbb{PP}_d$ are intersected for all $j \in \mathcal{J}$ the resulting feasible space is termed the "fundamental" polytope. Putting these ingredients together yields the LP relaxation that we study:

$$\text{minimize } \gamma^T \chi \text{ s.t. } P_j \chi \in \mathbb{PP}_d \forall j \in \mathcal{J}. \quad (3)$$

The statement of the optimization problem in (3) makes it apparent that compact representation of the parity polytope $\mathbb{PP}_d$ is crucial for efficient solution of the LP. Study of this polytope dates back some decades. In [36] Jeroslow gives an explicit representation of the parity polytope and shows that it has an exponential number of vertices and facets in d. Later, in [37], Yannakakis shows that the parity polytope has small lift, meaning that it is the projection of a polynomially faceted polytope in a dimension polynomial in d. Indeed, Yannakakis' representation requires a quadratic number of variables and inequalities. This is one of the descriptions discussed in [3] to state the LP decoding problem.

Yannakakis' representation of a vector $u \in \mathbb{PP}_d$ consists of variables $\mu_s \in [0, 1]$ for all even $s \leq d$. Variable $\mu_s$ indicates the contribution of binary (zero/one) vectors of Hamming weight s to u. Since u is a convex combination of even-weight binary vectors, $\Sigma_{\text{even } s}^d \mu_s = 1$. In addition, variables $z_{i,s}$ are used to indicate the contribution to $u_i$, the ith coordinate of u made by binary vectors of Hamming weight s. Overall, the following set of inequalities over $O(d^2)$ variables characterize the parity polytope (see [37] and [3] for a proof).

$$0 \leq u_i \leq 1 \forall i \in [d]$$

$$0 \leq z_{i,s} \leq \mu_s \forall i \in [d]$$

$$\sum_{\text{even } s}^d \mu_s = 1$$

$$u_i = \sum_{\text{even } s}^d z_{i,s} \forall i \in [d]$$

$$\sum_{i=1}^d z_{i,s} = s\mu_s \forall s \text{ even, } s \leq d.$$

This LP can be solved with standard solvers in polynomial time. However, the quadratic size of the LP prohibits its solution with standard solvers in real-time or embedded decoding applications. In Section IV-B we show that any vector $u \in \mathbb{PP}_d$ can always be expressed as a convex combination of binary vectors of Hamming weight r and r+2 for some even integer r. Based on this observation we develop a new formulation for the parity polytope that consists of O(d) variables and constraints. This is a key step towards the development of an efficient decoding algorithm. Its smaller description complexity also makes our formulation particularly well suited for high-density codes whose study we leave for future work.

Decoupled Relaxation and Optimization Algorithms

In this section we present the ADMM formulation of the LP decoding problem and summarize our contributions. In Section III-A we introduce the general ADMM template. We specialize the template to our problem in Section We state the algorithm in Section III-C and frame it in the language of message-passing in Section III-D.

A. ADMM Formulation

To make the LP (3) fit into the ADMM template we relax $\chi$ to lie in the hypercube, $\chi \in [0, 1]^N$, and add the auxiliary "replica" variables $z_j \in \mathbb{R}_d$ for all $j \in \mathcal{J}$. We work with a decoupled parameterization of the decoding LP.

$$\text{minimize } \gamma^T \chi$$

$$\text{subject to } P_j \chi = z_j \forall j \in \mathcal{J}$$

$$z_j \in \mathbb{PP}_d \forall j \in \mathcal{J}$$

$$\chi \in [0,1]^N. \quad (4)$$

The alternating direction method of multiplies works with an augmented Lagrangian which, for this problem, is $$L_\mu(x, z, \lambda) := \gamma^T x + \sum_{j \in \mathcal{J}} \lambda_j^T (P_j x - z_j) + \frac{\mu}{2} \sum_{j \in \mathcal{J}} \|P_j x - z_j\|_2^2. \quad (5)$$

Here $\lambda_j \in \mathbb{R}^d$ for $j \in \mathcal{J}$ are the Lagrange multipliers and $\mu > 0$ is a fixed penalty parameter. We use $\lambda$ and z to succinctly represent the collection of $\lambda_j$s and $z_j$s respectively. Note that the augmented Lagrangian is obtained by adding the two-norm term of the residual to the ordinary Lagrangian. The Lagrangian without the augmentation can be optimized via a dual subgradient ascent method [38], but our experiments with this approach required far too many message passing iterations for practical implementation. The augmented Lagrangian smoothes the dual problem leading to much faster convergence rates in practice [39]. For the interested reader, we provide a discussion of the standard dual ascent method in the appendix.

Let $\mathcal{X}$ and $\mathcal{Z}$ denote the feasible regions for variables $\chi$ and z respectively: $\mathcal{X}=[0, 1]^N$ and we use $z \in \mathcal{Z}$ to mean that $z_1 \times z_2 \times \ldots \times z_{|\mathcal{J}|} \in \mathbb{PP}_d \times \mathbb{PP}_d \times \ldots \times \mathbb{PP}_d$, the $|\mathcal{J}|$-fold product of $\mathbb{PP}_d$. Then we can succinctly write the iterations of ADMM as $$\chi^{k+1} := \mathrm{argmin}_{x \in \mathcal{X}} L_\mu(\chi, z^k, \lambda^k)$$

$$z^{k+1} := \mathrm{argmin}_{z \in \mathcal{Z}} L_\mu(\chi^{k+1}, z, \lambda^k)$$

$$\lambda_j^{k+1} := \lambda_j^k + \mu(P_j \chi^{k+1} - z_j^{k+1}).$$

The ADMM update steps involve fixing one variable and minimizing the other. In particular, $\chi^k$ and $z^k$ are the kth iterate and the updates to the $\chi$ and z variable are performed in an alternating fashion. We use this framework to solve the LP relaxation proposed by Feldman et al. and hence develop a distributed decoding algorithm.

B. ADMM Update Steps

The $\chi$-update corresponds to fixing z and $\lambda$ (obtained from the previous iteration or initialization) and minimizing $L_\mu(\chi, z, \lambda)$ subject to $\chi \in [0, 1]^N$. Taking the gradient of (5), setting the result to zero, and limiting the result to the hypercube $\chi = [0, 1]^N$, the $\chi$-update simplifies to $$x = \prod_{[0,1]^N} \left( P^{-1} \times \left( \sum_j P_j^T \left( z_j - \frac{1}{\mu} \lambda_j \right) - \frac{1}{\mu} \gamma \right) \right),$$

where $P = \Sigma_j P_j^T P_j$ and $\Pi_{[0,1]^N}(\cdot)$ corresponds to projecting onto the hypercube $[0, 1]^N$. The latter can easily be accomplished by independently projecting the components onto $[0, 1]$: setting the components that are greater than 1 equal to 1, the components less than 0 equal to 0, and leaving the remaining coordinates unchanged. Note that for any j, $P_j^T P_j$ is a N×N diagonal binary matrix with non-zero entries at (i,i) if and only if i participates in the jth parity check ($i \in \mathcal{N}_c(j)$). This implies that $\Sigma_j P_j^T P_j$ is a diagonal matrix with the (i,i)th entry equal to $|\mathcal{N}_v(i)|$. Hence $P^{-1} = (\Sigma_j P_j^T P_j)^{-1}$ is a diagonal matrix with $1/\mathcal{N}_v(i)|$ as the ith diagonal entry.

Component-wise, the update rule corresponds to taking the average of the corresponding replica values, $z_j$, adjusted by the scaled dual variable, $\lambda_j/\mu$, and taking a step in the negative log-likelihood direction. For any $j \in \mathcal{N}_v(i)$ let $z_j^{(i)}$ denote the component of $z_j$ that corresponds to the ith component of $\chi$, in other words the ith component of $P_j^T z_j$. Similarly let $\lambda_j^{(i)}$ be the ith component of $P_j^T \lambda_j$. With this notation the update rule for the ith component of $\chi$ is $$x_i = \prod_{[0,1]} \left( \frac{1}{|\mathcal{N}_v(i)|} \left( \sum_{j \in N_v(i)} \left( z_j^{(i)} - \frac{1}{\mu} \lambda_j^{(i)} \right) \right) - \frac{1}{\mu} \gamma_i \right).$$

Each variable update can be done in parallel.

The z-update corresponds to fixing $\chi$ and $\lambda$ and minimizing $L_\mu(\chi, \lambda, z)$ subject to $z_j \in \mathbb{PP}_d$ for all $j \in \mathcal{J}$. The relevant observation here is that the augmented Lagrangian is separable with respect to the $z_j$s and hence the minimization step can be decomposed (or "factored") into $\mathcal{J}$ separate problems, each of which be solved independently. This decouples the overall problem, making the approach scalable.

We start from (5) and concentrate on the terms that involve $z_j$. For each $j \in \mathcal{J}$ the update is to find the $z_j$ that minimizes $$\frac{\mu}{2} \|P_j x - z_j\|_2^2 - \lambda_j^T z_j \quad \text{s.t.} \quad z_j \in \mathbb{PP}_d.$$

Since the values of $\chi$ and $\lambda$ are fixed, so are $P_j \chi$ and $\lambda_j/\mu$. Setting $v = P_j \chi + \lambda_j/\mu$ and completing the square we get that the desired update $z_j^*$ is $$z_j^* = \mathrm{argmin}_{\tilde{z} \in \mathbb{PP}_d} \|v - \tilde{z}\|_2^2.$$

The z-update thus corresponds to $|\mathcal{J}|$ projections onto the parity polytope.

C. ADMM Decoding Algorithm

The complete ADMM-based algorithm is specified in the Algorithm 1 box. We declare convergence when the replicas differ from the $\chi$ variables by less than some tolerance $\epsilon > 0$.

D. ADMM Decoding as Message Passing Algorithm

We now present a message-passing interpretation of the ADMM decoding algorithm, Algorithm 1. We establish this interpretation using the "normal" factor graph representation [41]

---

Algorithm 1

Given a binary N-dimensional vector $\bar{x} \in \{0, 1\}^N$, parity check matrix H, and parameters $\mu$ and $\epsilon$, solve the decoding LP specified in (4)

1: Construct the negative log-likelihood vector $\gamma$ based on received word $\bar{x}$.

2: Construct the d × N matrix $P_j$ for all $j \in \mathcal{J}$.

3: Initialize $z_j$ and $\lambda_j$ as the all zeros vector for all $j \in \mathcal{J}$.

4: repeat

5: Update $x_i \leftarrow \Pi_{[0,1]} \left( \frac{1}{|\mathcal{N}_v(i)|} \left( \sum_{j \in N_v(i)} \left( z_j^{(i)} - \frac{1}{\mu} \lambda_j^{(i)} \right) \right) - \frac{1}{\mu} \gamma_i \right)$ for all $i \in \mathcal{I}$.

6: for all $j \in \mathcal{J}$ do

7: Set $v_j = P_j x + \lambda_j/\mu$.

8: Update $z_j \leftarrow \Pi_{\mathbb{PP}_d}(v_j)$ where $\Pi_{\mathbb{PP}_d}(\cdot)$ means project onto the parity polytope.

9: Update $\lambda_j \leftarrow \lambda_j + \mu (P_j x - z_j)$.

10: end for

11: until $\max_j \|P_j x - z_j\|_\infty < \epsilon$ return x.

(sometimes also called "Formey-style" factor graphs). One key difference between normal factor graphs and ordinary factor graphs is that the variables in normal factor graph representation are associated with the edges of a regular factor graphs [42], and the constraints of the normal graph representation are associated with both factor and variable nodes of the regular representation. See [41], [43] for details. In representing the ADMM algorithm as a message-passing algorithm the $\chi$ and the replicas z are the variables in the normal graph.

We denote by $\chi_{ij}(k)$ the replica associated with the edge joining node $i \in \mathcal{I}$ and node $j \in \mathcal{J}$, where k indicates the kth iteration. Note that $\chi_{ij_1}(k) = \chi_{ij_2}(k) = \chi_i^k$ for all $j_1, j_2 \in \mathcal{J}$, where $\chi_i^k$ is the value of $\chi_i$ at kth iteration in Algorithm 1. The "message" $m_{i \to j}(k) := \chi_{ij}(k)$ is passed from node i to node j at the beginning of the kth iteration. Incoming messages to check node j are denoted as $m_{\to j}(k) := \{m_{i \to j}(k): i \in \mathcal{N}_c(j)\}$. The $z_j$ can also be interpreted as the messages passed from check node j to the variable nodes in $\mathcal{N}_c(j)$, denoted as $m_{j \to}(k) :=$ $$\{m_{j \to i}(k): i \in \mathcal{N}_c(j)\}.$$

Let $\lambda'_j := \lambda_j / \mu$ and $\lambda'_{j,i} := \lambda_j^{(i)} / \mu.$ Then, for all $j \in \mathcal{N}_v(i)$ $$m_{i \to j}(k+1) = \prod_{[0,1]} \left( \frac{1}{|\mathcal{N}_v(i)|} \sum_{j \in \mathcal{N}_c(j)} [m_{j \to i}(k) - \lambda'_{j,i}(k)] - \frac{\gamma_i}{\mu} \right).$$

The z-update can be rewritten as $$m_{j \to}(k+1) = \Pi_{\mathbb{PP}_d}(m_{\to j}(k) + \lambda'_j(k)).$$

The $\lambda'_j$ updated is $$\lambda'_j(k+1) = \lambda'_j(k) + (m_{\to j}(k) - m_{j \to}(k)).$$

With this interpretation, it is clear that the ADMM algorithm decouples the decoding problem and can be performed in a distributed manner.

The Geometric Structure of $\mathbb{PP}_d$, and Efficient Projection onto $\mathbb{PP}_d$ In this section we develop our efficient projection algorithm. Recall that $\mathbb{P}_d = \{e \in \{0, 1\}^d | \|e\|_1 \text{ is even}\}$ and that $\mathbb{PP}_d = \text{conv}(\mathbb{P}_d)$. Generically we say that a point $v \in \mathbb{PP}_d$ if and only if there exist a set of $e_i \in \mathbb{P}_d$ such that $v = \Sigma_i \alpha_i e_i$ where $\Sigma_i \alpha_i = 1$ and $\alpha_i \geq 0$. In contrast to this generic representation, the initial objective of this section is to develop a novel "two-slice" representation of any point $v \in \mathbb{PP}_d$: namely that any such vector can be written as a convex combination of vectors with Hamming weight r and r+2 for some even integer r. We will then use this representation to construct an efficient projection.

We open the section in Section IV-A by describing the structured geometry of $\mathbb{PP}_d$ that we leverage, and laying out the results that will follow in ensuing sections. In Section IV-B, we prove a few necessary lemmas illustrating some of the symmetry structure of the parity polytope. In Section IV-C we develop the two-slice representation and connect the $l_1$-norm of the projection of any $v \in \mathbb{R}^d$ onto $\mathbb{PP}_d$ to the (easily computed) "constituent parity" of the projection of v onto the unit hypercube. In Section IV-D we present the projection algorithm.

A. Introduction to the Geometry of $\mathbb{PP}_d$

In this section we discuss the geometry of $\mathbb{PP}_d$. We develop intuition and foreshadow the results to come. We start by making a few observations about $\mathbb{PP}_d$.

First, we can classify the vertices of $\mathbb{PP}_d$ by their weight. We do this by defining $\mathbb{P}_d^r$, the constant-weight analog of $\mathbb{P}_d$, to be the set of weight-r vertices of $\mathbb{PP}_d$:

$$\mathbb{P}_d^r = \{e \in \{0,1\}^d | \|e\|_1 = r\}, \quad (6)$$

i.e., the constant-weight-r subcode of $\gamma_d$. Since all elements of $\mathbb{P}_d$ are in some $\mathbb{P}_d^r$ for some even r, $\mathbb{P}_d = \cup_{0 \leq r \leq d: r \text{ even}} \mathbb{P}_d^r$. This gives us a new way to think about characterizing the parity polytope, $$\mathbb{PP}_d = \text{conv}(\cup_{0 \leq r \leq d: r \text{ even}} \mathbb{P}_d^r).$$

Second, we define $\mathbb{PP}_d^r$ to be the convex hull of $\mathbb{P}_d^r$, $$\mathbb{PP}_d^r = \text{conv}(\mathbb{P}_d^r) = \text{conv}(\{e \in \{0,1\}^d | \|e\|_1 = r\}). \quad (7)$$

This object is a "permutahedron", so termed because it is the convex hull of all permutations of a single vector; in this case a length-d binary vector with r ones. Of course, $$\mathbb{PP}_d = \text{conv}(\cup_{0 \leq r \leq d: r \text{ even}} \mathbb{PP}_d^r).$$

Third, define the affine hyper-plane consisting of all vectors whose components sum to r as $$\mathcal{H}_d^r = \{x \in \mathbb{R}^d | 1^T x = r\}$$

where 1 is the length-d all-ones vector. We can visualize $\mathbb{PP}_d^r$ as a "slice" through the parity polytope defined as the intersection of $\mathcal{H}_d^r$ with $\mathbb{PP}_d$. In other words, a definition of $\mathbb{PP}_d^r$ equivalent to (7) is $$\mathbb{PP}_d^r = \mathbb{PP}_d \cap \mathcal{H}_d^r,$$

for r an even integer.

Finally, we note that the $\mathbb{PP}_d^r$ are all parallel. This follows since all vectors lying in any of these permutahedra are orthogonal to 1. We can think of the line segment that connects the origin to 1 as the major axis of the parity polytope with each "slice" orthogonal to the axis.

The above observations regarding the geometry of $\mathbb{PP}_d$ are illustrated in FIG. 10 Our development will be as follows. First, in Sec. IV-B we draw on a theorem from [44] about the geometry of permutahedra to assert that a point $v \in \mathbb{R}^d$ is in $\mathbb{PP}_d^r$ if and only if a sorted version of v is majorized (see Definition 1) by the length-d vector consisting of r ones followed by d−r zeros (the sorted version of any vertex of $\mathbb{PP}_d$). This allows us to characterize the $\mathbb{PP}_d^r$ easily. Second, we rewrite any point $u \in \mathbb{PP}_d$ as, per our second bullet above, a convex combination of points in slices of different weights r. In other words $u = \Sigma_{0 \leq r \leq d: r \text{ even}} \alpha_r u_r$ where $u_r \in \mathbb{PP}_d^r$ and the $\alpha_r$ are the convex weightings. We develop a useful characterization of $\mathbb{PP}_d$, the "two-slice" Lemma 2, that shows that two slices always suffices. In other words we can always write $u = \alpha u_r + (1-\alpha) u_{r+2}$ where $u_r \in \mathbb{PP}_d^r$, $u_{r+2} \in \mathbb{PP}_d^{r+2}$, $0 \leq \alpha \leq 1$, and $r = \lfloor \|u\| \rfloor_{even}$, where $\lfloor \alpha \rfloor_{even}$ is the largest even integer less than or equal to a. We term the lower weight, r, the "constituent" parity of the vector.

Third, in Sec.-C we show that given a point $v \in \mathbb{R}^d$ that we wish to project onto $\mathbb{PP}_d$, it is easy to identify the constituent parity of the projection. To express this formally, let $\Pi_{\mathbb{PP}_d}(v)$ be the projection of v onto $\mathbb{PP}_d$. Then, our statement is that we can easily find the even integer r such that $\Pi \mathbb{PP}_d(v)$ can be expressed as a convex combination of vectors in $\mathbb{PP}_d^r$ and $\mathbb{PP}_d^{r+2}$.

Finally, in Sec.-D we develop our projection algorithm. Roughly, our approach is as follows. Given a vector $v \in \mathbb{R}^d$ we first compute r, the constituent parity of its projection. Given the two-slice representation, projecting onto $\mathbb{PP}_d$ is equivalent to determining an $\alpha \in [0, 1]$, a vector $a \in \mathbb{PP}_d^r$, and a vector $b \in \mathbb{PP}_d^{r+2}$ such that the $l_2$ norm of $v-\alpha a-(1-\alpha)b$ is minimized.

In [45] we showed that, given $\alpha$, this projection can be accomplished in two steps. We first project v onto $\alpha \mathbb{PP}_d^r = \{x \in \mathbb{R}^d | 0 \le \chi_i \le \alpha, \Sigma_{i=1}^d \chi_i = \alpha r\}$ a scaled version of $\mathbb{PP}_d^r$, scaled by the convex weighting parameter. Then we project the residual onto $(1-\alpha)\mathbb{PP}_d^r$. The object $\alpha \mathbb{PP}_d^r$ is an $l_1$ ball with box constraints. Projection onto $\alpha \mathbb{PP}_d^r$ can be done efficiently using a type of waterfilling. Since the function $\min_{a \in \mathbb{PP}_d^r, b \in \mathbb{PP}_d^{r+2}} \|v-\alpha a-(1-\alpha)b\|_2^2$ is convex in a we can perform a one-dimensional line search (using, for example, the secant method) to determine the optimal value for $\alpha$ and thence the desired projection.

In contrast to the original approach, in Section.D we develop a far more efficient algorithm that avoids the pair of projections and the search for $\alpha$. In particular, taking advantage of the convexity in $\alpha$ we use majorization to characterize the convex hull of $\mathbb{PP}_d^r$ and $\mathbb{PP}_d^{r+2}$ in terms of a few linear constraints (inequalities). As projecting onto the parity polytope is equivalent to projecting onto the convex hull of the two slices, we use the characterization to express the projection problem as a quadratic program, and develop an efficient method that directly solves the quadratic program. Avoiding the search over a yields a considerable speed-up over the original approach taken in [45].

B. Permutation Invariance of the Parity Polytope and its Consequences

Let us first describe some of the essential features of the parity polytope that are critical to the development of our efficient projection algorithm. First, note the following Proposition 1: $u \in \mathbb{PP}_d$ if and only if $\Sigma u$ is in the parity polytope for every permutation matrix $\Sigma$.

This proposition follows immediately because the vertex set $\mathbb{P}_d$ is invariant under permutations of the coordinate axes.

Since we will be primarily concerned with projections onto the parity polytope, let us consider the optimization problem $$\text{minimize}_z \|v-z\|_2 \text{ subject to } z \in \mathbb{PP}_d. \quad (8)$$

The optimal z* of this problem is the Euclidean projection of v onto $\mathbb{PP}_d$, which we denote by $z^* = \Pi_{\mathbb{PP}_d}(v)$. Again using the symmetric nature of $\mathbb{PP}_d$, we can show the useful fact that if v is sorted in descending order, then so is $\Pi_{\mathbb{PP}_d}(v)$.

Proposition 2: Given a vector $v \in \mathbb{R}^d$, the component-wise ordering of $\Pi_{\mathbb{PP}_d}(v)$ is same as that of v.

Proof: We prove the claim by contradiction. Write $z^* = \Pi_{\mathbb{PP}_d}(v)$ and suppose that for indices i and j we have $v_i > v_j$ but $z^*_i < z^*_j$. Since all permutations of z* are in the parity polytope, we can swap components i and j of z* to obtain another vector in $\mathbb{PP}_d$. Under the assumption $z^*_j > z^*_i$ and $v_i - v_j > 0$ we have $z^*_j(v_i - v_j) > z^*_i(v_i - v_j)$. This inequality implies that $(v_i - z^*_i)^2 + (v_j - z^*_j)^2 > (v_i - z^*_j)^2 + (v_j - z^*_i)^2$, and hence we get that the Euclidean distance between v and z* is greater than the Euclidean distance between v and the vector obtained by swapping the components.

These two propositions allow us assume through the remainder of this section that our vectors are presented sorted in descending order unless explicitly stated otherwise.

The permutation invariance of the parity polytope also lets us also employ powerful tools from the theory of majorization to simplify membership testing and projection. The fundamental theorem we exploit is based on the following definition.

Definition 1: Let u and w be d-vectors sorted in decreasing order. The vector w majorizes u if $$\sum_{k=1}^q u_k \le \sum_{k=1}^q w_k \forall 1 \le q < d,$$

$$\sum_{k=1}^d u_k = \sum_{k=1}^d w_k.$$

Our results rely on the following Theorem, which states that a vector lies in the convex hull of all permutations of another vector if and only if the former is majorized by the latter (see [44] and references therein).

Theorem 1: Suppose u and w are d-vectors sorted in decreasing order. Then u is in the convex hull of all permutations of w if and only if w majorizes u.

To gain intuition for why this theorem might hold, suppose that u is in the convex hull of all of the permutations of w. Then $u = \Sigma_{i=1}^n p_i \Sigma_i w$ with $\Sigma_i$ being permutation matrices, $p_i \ge 0$, and $1^T p = 1$. The matrix $Q = \Sigma_{i=1}^n p_i \Sigma_i$ is doubly stochastic, and one can immediately check that if $u = Q w$ and $Q$ is doubly stochastic, then w majorizes u.

To apply majorization theory to the parity polytope, begin with one of the permutahedra $\mathbb{PP}_d^s$. We recall that $\mathbb{PP}_d^s$ is equal to the convex hull of all binary vectors with weight s, equivalently the convex hull of all permutations of the vector consisting of s ones followed by d−s zeros. Thus, by Theorem 1, $u \in [0, 1]^d$ is in $\mathbb{PP}_d^s$ if and only if $$\sum_{k=1}^q u_k \le \min(q, s) \forall 1 \le q < d, \quad (9)$$

$$\sum_{k=1}^d u_k = s. \quad (10)$$

The parity polytope $\mathbb{PP}_d$ is simply the convex hull of all of the $\mathbb{PP}_d^s$ with s even. Thus, we can use majorization to provide an alternative characterization of the parity polytope to that of Yannakakis or Jeroslow.

Lemma 1: A sorted vector $u \in \mathbb{PP}_d$ if and only if there exist non-negative coefficients $\{\mu_s\}_{\text{even } s \le d}$ such that $$\sum_{s \text{ even}}^d \mu_s = 1, \mu_s \ge 0 \quad (11)$$

$$\sum_{k=1}^q u_k \le \sum_{s \text{ even}}^d \mu_s \min(q, s) \forall 1 \le q < d \quad (12)$$

$$\sum_{k=1}^d u_k = \sum_{s \text{ even}}^d \mu_s s. \quad (13)$$

Proof: First, note that every vertex of $\mathbb{PP}_d$ of weight s satisfies these inequalities with $\mu_s = 1$ and $\mu_{s'} = 0$ for $s' \ne s$. Thus $u \in \mathbb{PP}_d$ must satisfy (11)-(13). Conversely, if u satisfies (11)-(13), then u is majorized by the vector $$w = \sum_{s \text{ even}}^d \mu_s b_s$$

where $b_s$ is a vector consisting of s ones followed by d−s zeros. w is contained in $\mathbb{PP}_d$ as are all of its permutations. Thus, we conclude that u is also contained in $\mathbb{PP}_d$.

While Lemma 1 characterizes the containment of a vector in $\mathbb{PP}_d$, the relationship is not one-to-one; for a particular $u \in \mathbb{PP}_B$ there can be many sets $\{\mu_s\}$ that satisfy the lemma. We will next show that there is always one assignment of $\mu_s$ with only two non-zero $\mu_s$.

C. Constituent Parity of the Projection

For $\alpha \in \mathbb{R}$, let $\lfloor \alpha \rfloor_{even}$ denote the "even-floor" of a, i.e., the largest even integer r such that $r \leq a$. Define the "even-ceiling," $\lceil a \rceil_{even}$ similarly. For a vector u we term $\lfloor \|u\|_1 \rfloor_{even}$ the constituent parity of vector u. In this section we will show that if $u \in \mathbb{PP}_d$ has constituent parity r, then it can be written as a convex combination of binary vectors with weight equal to r and r+2. This result is summarized by the following Lemma 2: ("Two-slice" lemma) A vector $u \in \mathbb{PP}_d$ iff u can be expressed as a convex combination of vectors in $\mathbb{PP}_d^r$ and $\mathbb{PP}_d^{r+2}$ where $r = \lfloor \|u\|_1 \rfloor_{even}$.

Proof: Consider any (sorted) $u \in \mathbb{PP}_d$. Lemma 1 tells us that there is always (at least one) set $\{\mu_s\}$ that satisfy (11)-(13). Letting r be defined as in the lemma statement, we define $\alpha$ to be the unique scalar between zero and one that satisfies the relation $\|u\|_1 = \alpha r + (1-\alpha)(r+2)$:

$$\alpha = \frac{2 + r - \|u\|_1}{2}. \quad (14)$$

Then, we choose the following candidate assignment: $\mu_r = \alpha$, $\mu_{r+2} = 1 - \alpha$, and all other $\mu_s = 0$. We show that this choice satisfies (11)-(13) which will in turn imply that there is a $u_r \in \mathbb{PP}_d^r$ and a $u_{r+2} \in \mathbb{PP}_d^{r+2}$ such that $u = \alpha u_r + (1-\alpha) u_{r+2}$.

First, by the definition of $\alpha$, (11) and (13) are both satisfied. Further, for the candidate set the relations (12) and (13) simplify to $$\sum_{k=1}^{q} u_k \leq \alpha \min(q, r) + (1-a) \min(q, r+2), \quad \forall 1 \leq q < d, \quad (15)$$

$$\sum_{k=1}^{d} u_k = \alpha r + (1 - \alpha)(r + 2). \quad (16)$$

To show that (15) is satisfied is straightforward for the cases $q \leq r$ and $q \geq r+2$. First consider any $q \leq r$. Since $\min(q, r) = \min(q, r+2) = q$, $u_k \leq 1$ for all k, and there are only q terms, (15) must hold. Second, consider any $q \geq r+2$. We use (16) to write $\sum_{k=1}^{q} u_k = \alpha r + (1-\alpha)(r+2) - \sum_{q+1}^{d} u_k$. Since $u_k \geq 0$ this is upper bounded by $\alpha r + (1-\alpha)(r+2)$ which we recognize as the right-hand side of (15) since $r = \min(q, r)$ and $r+2 = \min(q, r+2)$.

It remains to verify only one more inequality in (15) namely the case when $q = r+1$, which is $$\sum_{k=1}^{r+1} u_k \leq \alpha r + (1-\alpha)(r+1) = r + 1 - \alpha.$$

To show that the above inequality holds, we maximize the right-hand-side of (12) across all valid choices of $\{\mu_s\}$ and show that the resulting maximum is exactly $r+1-\alpha$. Since this maximum is attainable by some choice of $\{\mu_s\}$ and our choice meets that bound, our choice is a valid choice.

The logic is as follows. Since $u \in \mathbb{PP}_d$ any valid choice for $\{\mu_s\}$ must satisfy (11) which, for $g = r+1$, is $$\sum_{k=1}^{r+1} u_k \leq \sum_{s \, even}^{d} \mu_s \min(s, r+1). \quad (17)$$

To see that across all valid choice of $\{\mu_s\}$ the largest value attainable for the right hand side is precisely $r+1-\alpha$ consider the linear program maximize $\Sigma_{s \, even} \mu_s \min(s, r+1)$ subject to $\Sigma_{s \, even} \mu_s = 1$ $\Sigma_{s \, even} \mu_s s = (1-\alpha)(r+2)$ $\mu_s \geq 0$.

The first two constraints are simply (11) and (13). Recognizing $\alpha r + (1-a)(r+2) = r + 2 - 2\alpha$, the dual program is minimize $(r+2-2\alpha)\lambda_1 + \lambda_2$ subject to $\lambda_1 s + \lambda_2 \geq \min(s, r+1) \forall s$ even.

Setting $\mu_r = \alpha$, $\mu_{r+2} = (1-\alpha)$, the other primal variable to zero, $\lambda_1 = \frac{1}{2}$, and $\lambda_2 = r/2$, satisfies the Karush-Kuhn-Tucker (KKT) conditions for this primal/dual pair of LPs. The associated optimal cost is $r+1-\alpha$. Thus, the right hand side of (17) is at most $r+1-\alpha$.

We have proved that if $u \in \mathbb{PP}_d$ then the choice of $r = \lfloor \|u\|_1 \rfloor_{even}$ and $\alpha$ as in (14) satisfies the requirements of Lemma 1 and so we can express u as $u = \alpha u_r + (1-\alpha) u_{r+2}$. The converse—given a vector u that is a convex combination of vectors in $\mathbb{PP}_d^r$ and $\mathbb{PP}_d^{r+2}$ it is in $\mathbb{PP}_d$—holds becauseconv$(\mathbb{PP}_d^r \cup \mathbb{PP}_d^{r+2}) \subseteq \mathbb{PP}_d$.

A useful consequence of Theorem 1 is the following corollary.

Corollary 1: Let u be a vector in $[0, 1]^d$. If $\Sigma_{k=1}^{d} u_k$ is an even integer then $u \in \mathbb{PP}_d$.

Proof: Let $\Sigma_{k=1}^{d} u_k = s$. Since u is majorized by a sorted binary vector of weight s then, by Theorem 1, $u \in \mathbb{PP}_d^s$ which, in turn, implies $u \in \mathbb{PP}_d$.

We conclude this section by showing that we can easily compute the constituent parity of $\Pi_{\mathbb{PP}_d}(v)$ without explicitly computing the projection of v.

Lemma 3: For any vector $v \in \mathbb{R}^d$, let $z = \Pi_{[0,1]^d}(v)$, the projection of v onto $[0, 1]^d$ and denote by $\Pi_{\mathbb{PP}_d}(v)$ the projection of v onto the parity polytope. Then $$\lfloor \|z\|_1 \rfloor_{even} \leq \|\Pi_{\mathbb{PP}_d}(v)\|_1 \leq \lceil \|z\|_1 \rceil_{even}.$$

That is, we can compute the constituent parity of the projection of v by projecting v onto $[0, 1]^d$ and computing the even floor.

Proof: Let $\rho_U = \lceil \|z\|_1 \rceil_{even}$ and $p\rho_L = \lfloor \|z\|_1 \rfloor_{even}$. We prove the following fact: given any $y' \in \mathbb{PP}_d$ with $\|y'\|_1 > \rho_U$ there exits a vector $y \in [0, 1]^d$ such that $\|y\|_1 = \rho_U$, $y \in \mathbb{PP}_d$, and $\|v - y\|_2^2 < \|v - y'\|_2^2$. The implication of this fact will be that any vector in the parity polytope with $l_1$ norm strictly greater that $\rho_U$ cannot be the projection of v. Similarly we can also show that any vector with $l_1$ norm strictly less than $\rho_L$ cannot be the projection on the parity polytope.

First we construct the vector y based on y' and z. Define the set of "high" values to be the coordinates on which $y'_i$ is greater than $z_i$, i.e., $\mathcal{H} := \{i \in [d] | y'_i > z_i\}$. Since by assumption $\|y'\|_1 > \rho_U \geq \|z\|_1$ we know that $|\mathcal{H}| \geq 1$. Consider the test vector t defined component-wise as $$t_i = \begin{cases} z_i & \text{if } i \in \mathcal{H}; \\ y'_i & \text{otherwise.} \end{cases}$$

Note that $\|t\|_1 \leq \|z\|_1 \leq \rho_U < \|y'\|_1$. The vector t differs from y' only in $\mathcal{H}$. Thus, by changing (reducing) components of y' in the set $\mathcal{H}$ we can obtain a vector y such that $\lambda y\|_1 = \rho_U$. In particular there exists a vector y with $\|y\|_1 = \rho_U$ such that $y'_i \geq y_i \geq z_i$ for $i \in \mathcal{H}$ and $y_i = y'_i$ for $i \notin \mathcal{H}$. Since the $l_1$ norm of y is even and it is in $[0, 1]^d$ we have by Corollary 1 that $y \in \mathbb{PP}_d$.

We next show that for all $i \in \mathcal{H}$, $|v_i - y_i| \leq |v_i - y'_i|$. The inequality will be strict for at least one i yielding $\|v-y\|_2^2 < \|v-y'\|_2^2$ and thereby proving the claim.

We start by noting that $y' \in \mathbb{PP}_d$ so $y'_i \in [0, 1]$ for all i. Hence, if $z_i < y'_i$ for some i we must also have $z_i < 1$, in which case $v_i \leq z_i$ since $z_i$ is the projection of $v_i$ onto $[0, 1]$. In summary, $z_i < 1$ iff $v_i < 1$ and when $z_i < 1$ then $v_i \leq z_i$. Therefore, if $y'_i > z_i$ then $z_i \geq v_i$. Thus for all $i \in \mathcal{H}$ we get $y'_i \geq y_i \geq z_i \geq v_i$ where the first inequality is strict for at least one i. Since $y_i = y'_i$ for $i \notin \mathcal{H}$ this means that $|v_i - y_i| \leq |v_i - y'_i|$ for all i where the inequality is strict for at least one value of i. Overall, $\|v-y\|_2^2 < \|v-y'\|_2^2$ and both $y \in \mathbb{PP}_d$ (by construction) and $y' \in \mathbb{PP}_d$ (by assumption). Thus, y' cannot be the projection of v onto $\mathbb{PP}_d$. Thus the $l_1$ norm of the projection of v, $\|\Pi_{\mathbb{PP}_d}(v)\|_1 \leq \rho_U$. A similar argument shows that $\|\Pi_{\mathbb{PP}_d}(v)\|_1 \geq \rho_L$, and so $\|\Pi_{\mathbb{PP}_d}(v)\|_1$ must lie in $[\rho_L, \rho_U]$

D. Projection Algorithm

In this section we formulate a quadratic program (Problem PQP) for the projection problem and then develop an algorithm (Algorithm 2) that efficiently solves the quadratic program.

Given a vector $v \in \mathbb{R}^d$, set $r = \lfloor \|\Pi_{[0,1]^d}(v)\|_1 \rfloor_{even}$. From Lemma 3 we know that the constituent parity of $z^* := \Pi_{\mathbb{PP}_d}(v)$ is r. We also know that $z^*$ is sorted in descending order if v is. Let S be a $(d-1) \times d$ matrix with diagonal entries set to 1, $S_{i,i+1} = -1$ for $1 \leq i \leq d-1$, and zero everywhere else:

$$S = \begin{bmatrix} 1 & -1 & 0 & 0 & \ldots & 0 & 0 \\ 0 & 1 & -1 & 0 & \ldots & 0 & 0 \\ 0 & 0 & 1 & -1 & \ldots & 0 & 0 \\ \vdots & & & \ddots & \ddots & & \vdots \\ 0 & 0 & 0 & 0 & \ldots & -1 & 0 \\ 0 & 0 & 0 & 0 & \ldots & 1 & -1 \end{bmatrix}.$$

The constraint that $z^*$ has to be sorted in decreasing order can be stated as $Sz^* \geq 0$, where 0 is the all-zeros vector.

In addition, Lemma 2 implies that $z^*$ is a convex combination of vectors of Hamming weight r and r+2. Using inequality (15) we get that a d-vector $z \in [0, 1]^d$, with $$\sum_{i=1}^{d} z_i = \alpha r + (1-\alpha)(r+2), \tag{18}$$

is a convex combination of vectors of weight r and r+2 if it satisfies the following bounds:

$$\sum_{k=1}^{q} z_{(k)} \leq \alpha \min(q, r) + (1-\alpha) \min(q, r+2) \; \forall \; 1 \leq q < d, \tag{19}$$

where $z_{(k)}$ denotes the kth largest component of z. As we saw in the proof of Lemma 1, the fact that the components of z are no more than one implies that inequalities (19) are satisfied for all $q \geq r$. Also, (18) enforces the inequalities for $q \geq r+2$. Therefore, inequalities in (19) for $q \leq r$ and $q \geq r+2$ are redundant. Note that in addition we can eliminate the variable $\alpha$ by solving (18) giving $$\alpha = 1 + \frac{r - \sum_{k=1}^{d} z_k}{2}$$

(see also (14)). Therefore, for a sorted vector v, we can write the projection onto $\mathbb{PP}_d$ as the optimization problem $$\text{minimize} \; \frac{1}{2}\|v - z\|_2^2$$

$$\text{subject to } 0 \leq z_i \leq 1 \; \forall \; i$$

$$Sz \geq 0$$

$$0 \leq 1 + \frac{r - \sum_{k=1}^{d} z_k}{2} \leq 1 \tag{20}$$

$$\sum_{k=1}^{r+1} z_k \leq r - \frac{r - \sum_{k=1}^{d} z_k}{2}. \tag{21}$$

The last two constraints can be simplified as follows. First, constraint (20) simplifies to $r \leq \sum_{k=1}^{d} z_k \leq r+2$. Next, defining the vector $$f_r = \Big( \underbrace{1, 1, \ldots, 1}_{r+1}, \underbrace{-1, -1, \ldots, -1}_{d-r-1} \Big)^T. \tag{22}$$

we can rewrite inequality (21) as $f_r^T z \leq r$. Using these simplifications yields the final form of our quadratic program:

Problem PQP:

$$\text{minimize} \; \frac{1}{2}\|v - z\|_2^2$$

$$\text{subject to } 0 \leq z_i \leq 1 \; \forall \; i \tag{23}$$

$$Sz \geq 0 \tag{24}$$

$$r \leq 1^T z \leq r+2 \tag{25}$$

$$f_r^T z \leq r. \tag{26}$$

The projection algorithm we develop efficiently solves the KKT conditions of PQP. The objective function is strongly convex and the constraints are linear. Hence, the KKT conditions are not only necessary but also sufficient for optimality. To formulate the KKT conditions, we first construct the Lagrangian with dual variables $\beta$, $\mu$, $\gamma$, $\xi$, $\theta$, and $\zeta$:

$$\mathcal{L} = \frac{1}{2}\|v - z\|_2^2 - \beta(r - f_r^T z) -$$
$$\mu^T(1-z) - \gamma^T z - \xi(r+2 - 1^T z) - \zeta(1^T z - r) - \theta^T Sz.$$

The KKT conditions are then given by stationarity of the Lagrangian, complementary slack-ness, and feasibility.

$$z = v - \beta f_r - \mu + \gamma - (\xi - \zeta)1 + S^T\theta.$$

$$0 \leq \beta \perp f_r^T z - r \leq 0$$

$$0 \leq \mu \perp z \leq 1$$

$$0 \leq \gamma \perp z \geq 0$$

$$0 \leq \theta \perp Sz \geq 0$$

$$0 \leq \xi \perp 1^T z - r - 2 \leq 0$$

$$0 \leq \zeta \perp 1^T z - r \geq 0. \quad (27)$$

A vector z that satisfies (27) and the following orthogonality conditions is equal to the projection of v onto $\mathbb{PP}_d$.

To proceed, set $$\beta_{max} = \frac{1}{2}[v_{r+1} - v_{r+2}]$$

and define the parameterized vector $$z(\beta) := \Pi_{[0,1]^d}(v - \beta f_r). \quad (28)$$

The following lemma implies that the optimizer of PQP, i.e., $z^* = \Pi_{\mathbb{PP}_d}(v)$, is $z(\beta_{opt})$ for some $\beta_{opt} \in [0, \beta_{max}]$.

Lemma 4: There exists a $\alpha_{opt} \beta [0, \beta_{max}]$ such that $z(\alpha_{opt})$ satisfies the KKT conditions of the quadratic program PQP.

Proof: Note that when $\beta > \beta_{max}$ we have that $z_{r+1}(\beta) < z_{r+2}(\beta)$ and $z(\beta)$ is ordered differently from v and $f_r^T z(\beta) < r$. Consequently $z(\beta)$ cannot be the projection onto $\mathbb{PP}_d$ for $\beta > \beta_{max}$. At the other boundary of the interval, when $\beta = 0$ we have $z(0) = \Pi_{[0,1]^d}(v)$. If $f_r^T z(0) = r$, then $z(0) \in \mathbb{PP}_d$ by Corollary 1. But since $z(0)$ is the closest point in $[0, 1]^d$ to v, it must also be the closest point in $\mathbb{PP}_d$.

Assume now that $f_r^T z(0) > r$. Taking the directional derivative with respect to $\beta$ increasing, we obtain the following:

$$\frac{\partial f_r^T z(\beta)}{\partial \beta} = f_r^T \frac{\partial z(\beta)}{\partial \beta} \quad (29)$$

$$= \sum_{k:\, 0 < z_k(\beta) < 1} -f_{r,k}^2$$

$$= -|\{k \mid 1 \leq k \leq d, 0 < z_k(\beta) < 1\}| < 0.$$

proving that $f_r^T z(\beta)$ is a decreasing function of $\beta$. Therefore, by the mean value theorem, there exists a $\beta_{opt} \in [0, \beta_{max}),]$ such that $f_r^T z(\beta_{opt}) = r$.

First note that $z(\beta_{opt})$ is feasible for Problem PQP. We need only verify (25). Recalling that r is defined as $r = \lfloor \|\Pi_{[0,1]^d}(v)\|_1 \rfloor_{even}$, we get the lower bound:

$$1^T z(\beta_{opt}) \geq f_r^T z(\beta_{opt}) = r.$$

The components of $z(\beta_{opt})$ are all less than one, so $\Sigma_{k=1}^{r+1} z_k(\beta_{opt}) \leq r+1$. Combining this with the equality $f_r^T z(\beta_{opt}) = r$ tells us that $\Sigma_{k=r+2}^d z_k(\beta_{opt}) \leq 1$. We therefore find that $1^T z(\beta_{opt})$ is no more than r+2.

To complete the proof, we need only find dual variables to certify the optimality. Setting $\xi$, $\zeta$, and $\theta$ to zero, and $\mu$ and $\gamma$ to the values required to satisfy (27) provides the necessary assignments to satisfy the KKT conditions.

Lemma 4 thus certifies that all we need to do to compute the projection is to compute the optimal $\beta$. To do so, we use the fact that the function $f_r^T z(\beta)$ is a piecewise linear function of $\beta$. For a fixed $\beta$, define the active set to be the indices where $z(\beta)$ is strictly between 0 and 1

$$\mathcal{A}(\beta) := \{k \mid 1 \leq k \leq d, 0 < z_k(\beta) < 1\}. \quad (30)$$

Let the clipped set be the indices where $z(\beta)$ is equal to 1.

$$\mathcal{C}(\beta) := \{k \mid 1 \leq k \leq d, z_k(\beta) = 1\}. \quad (31)$$

Let the zero set be the indices where $z(\beta)$ is equal to zero $$\mathcal{Z}(\beta) := \{k \mid 1 \leq k \leq d, z_k(\beta) = 0\}. \quad (32)$$

Note that with these definitions, we have $$f_r^T z(\beta) = |\mathcal{C}(\beta)| + \sum_{j \in \mathcal{A}(\beta)} (z_j - \beta) \quad (33)$$

$$= |\mathcal{C}(\beta)| - \beta|\mathcal{A}(\beta)| + \sum_{j \in \mathcal{A}(\beta)} z_j$$

Our algorithm simply increases beta until the active set changes, keeping track of the sets $\mathcal{A}(\beta)$, $\mathcal{C}(\beta)$, and $\mathcal{Z}(\beta)$. We break the interval $[0, \beta_{max}]$ into the locations where the active set changes, and compute the value of $f_r^T z(\beta)$ at each of these breakpoints until $f_r^T z(\beta) < r$. At this point, we have located the appropriate active set for optimality and can find $\beta_{opt}$ by solving the linear equation (33).

The breakpoints themselves are easy to find: they are the values of $\beta$ where an index is set equal to one or equal to zero. First, define the following sets $$\mathcal{B}_1 := \{v_i - 1 \mid 1 \leq i \leq r+1\},$$

$$\mathcal{B}_2 := \{v_i \mid 1 \leq i \leq r+1\},$$

$$\mathcal{B}_3 := \{-v_i \mid r+2 \leq i \leq d\},$$

$$\mathcal{B}_4 := \{-v_i + 1 \mid r+2 \leq i \leq d\}.$$

The sets $\mathcal{B}_1$ and $\mathcal{B}_2$ concern the r+1 largest components of v; $\mathcal{B}_3$ and $\mathcal{B}_4$ the smallest components. The set of breakpoints is $$B := \left\{ \beta \in \bigcup_{j=1}^4 \mathcal{B}_j \,\middle|\, 0 \leq \beta \leq \beta_{max} \right\} \cup \{0, \beta_{max}\}.$$

There are thus at most 2d+2 breakpoints.

To summarize, our Algorithm 2 sorts the input vector, computes the set of breakpoints, and then marches through the breakpoints until it finds a value of $\beta_i \in \mathcal{B}$ with $f_r^T z(\beta_i) \leq r$. Since we will also have $f_r^T z(\beta_{i-}) > r$, the optimal $\beta$ will lie in $[\beta_{i-1}, \beta_i]$ and can be found by solving (33). In the algorithm box for Algorithm 2, b is the largest and a is the smallest index in the active set. We use V to denote the sum of the elements in the active set and $\Lambda$ the total sum of the vector at the current break point. Some of the awkward if statements in the main for loop take care of the cases when the input vector has many repeated entries.

Algorithm 2 requires two sorts (sorting the input vector and sorting the breakpoints), and then an inspection of at most 2d breakpoints. Thus, the total complexity of the algorithm is linear plus the time for the two sorts.

---

Algorithm 2

Given $u \in \mathbb{R}^d$ determine its projection on $\mathbb{PP}_d$, $z^*$

1: Permute u to produce a vector v whose components are sorted in decreasing order, i.e., $v_1 \geq v_2 \geq \ldots \geq v_d$. Let Q be the corresponding permutation matrix, i.e., v = Qu.

---
Algorithm 2
---

Given $u \in \mathbb{R}^d$ determine its projection on $\mathbb{PP}_d$, $z^*$

2: Compute $\hat{z} \leftarrow \Pi_{[0,1]^d}(v)$.
3: Assign $r = \lfloor \|\hat{z}\|_1 \rfloor_{even}$ and $\beta_{max} = \frac{1}{2} [\hat{z}_{r+1} - \hat{z}_{r+2}]$.
4: Define $f_r$ as in (22).
5: if $f_{r+1}^T \hat{z} \leq r$ then
6:    Return $z^* = \hat{z}$.
7: end if
8: Assign $\epsilon_1 = \{v_i - 1 \mid 1 \leq i \leq r+1\}$,
   $\mathcal{L}_1 = \{v_i \mid 1 \leq i \leq r+1\}$,
   $\epsilon_2 = \{-v_i \mid r+2 \leq i \leq d\}$,
   $\mathcal{L}_2 = \{-v_i + 1 \mid r+2 \leq i \leq d\}$.
9: Assign the set of breakpoints:
   $\mathcal{B} := \{\beta \in \cup_{j=1}^2 \epsilon_j \cup \mathcal{L}_j) \mid 0 \leq \beta \leq \beta_{max}\} \cup \{0, \beta_{max}\}$.
10: Index the breakpoints in $\mathcal{B}$ in a sorted manner to get $\{\beta_i\}_i$ where $\beta_1 \leq \beta_2 \leq \ldots \leq \beta_{|\mathcal{B}|}$.
11: Initialize a as the smallest index such that $0 < \hat{z}_a < 1$.
12: Initialize b as the largest index such that $0 < \hat{z}_b < 1$.
13: Initialize sum $V = f_r^T \hat{z}$.
14: for $i = 1$ to $|\mathcal{B}|$ do
15:   Set $\beta_0 \leftarrow \beta_i$.
16:   if $\beta_i \in \epsilon_1 \cup \epsilon_2$ then
17:     Update $a \leftarrow a - 1$.
18:     Update $V \leftarrow V + v_a$.
19:   else
20:     Update $b \leftarrow b + 1$.
21:     Update $V \leftarrow V - v_b$.
22:   end if
23:   if $i < d$ and $\beta_i \neq \beta_{i+1}$ then
24:     $\Lambda \leftarrow (a-1) + V - \beta_0(b - a + 1)$
25:     if $\Lambda \leq r$ then break
26:   else if $i = d$ then
27:     $\Lambda \leftarrow (a-1) + V - \beta_0(b - a + 1)$
28:   end if
29: end for If we work with an (un-augmented) Lagrangian $$L_0(x, z, \lambda) := \gamma^T x + \sum_{j \in \mathcal{J}} \lambda_j^T (P_j x - z_j)$$

the dual subgradient ascent method consists of the iterations:

$$\chi^{k+1} := \arg\min_{\chi \in \mathcal{X}} L_0(\chi, z^k, \lambda^k)$$

$$z^{k+1} := \arg\min_{z \in \mathcal{Z}} L_0(\chi^k, z, \lambda^k)$$

$$\lambda_j^{k+1} := \lambda_j^k + \mu(P_j \chi^{k+1} - z_j^{k+1}).$$

Note here that the $\chi$ and $z$ updates are run with respect to the $k$ iterates of the other variables, and can be run completely in parallel.

The $\chi$-update corresponds to solving the very simple LP:

$$\text{minimize} \left(\gamma + \sum_{j \in \mathcal{J}} P_j^T \lambda_j^k\right)^T x$$

subject to $x \in [0, 1]^N$.

This results in the assignment:

$$x^{k+1} = \theta\left(-\gamma - \sum_{j \in \mathcal{J}} P_j' \lambda_j^k\right)$$

where $$\theta(t) = \begin{cases} 1 & t > 0 \\ 0 & t \leq 0 \end{cases}$$

is the Heaviside function.

For the z-update, we have to solve the following LP for each $j \in \mathcal{J}$ $$\text{maximize } \lambda_j^{k^T} z_j$$

subject to $z_j \in \mathbb{PP}_d$. (34)

Maximizing a linear function over the parity polytope can be performed in linear time. First, note that the optimal solution necessarily occurs at a vertex, which is a binary vector with an even hamming weight. Let r be the number of positive components in the cost vector $\lambda_j^k$. If r is even, the vector $v \in \mathbb{PP}_d$ which is equal to 1 where $\lambda_j^k$ is positive and zero elsewhere is a solution of (34), as making any additional components nonzero decreases the cost as does making any of the components equal to 1 smaller. If $\lambda_j^k$ is odd, we only need to compare the cost of the vector equal to 1 in the r−1 largest components and zero elsewhere to the cost of the vector equal to 1 in the r+1 largest components and equal to zero elsewhere.

The procedure to solve (34) is summarized in Algorithm 3. Note that finding the smallest positive element and largest nonnegative element can be done in linear time. Hence, the complexity of Algorithm 3 is O(d).

While this subgradient ascent method is quite simple, it is requires vastly more iterations than the ADMM method, and thus we did not pursue this any further.

---
Algorithm 3 Given a binary d-dimensional vector c, maximize $c^T z$ subject to $z \in \mathbb{PP}_d$.
---

1: Let r be the number of positive elements in c.
2: if r is even then
3:    Return $z^*$ where $z_i^* = 1$ if $c_i > 0$ and $z_i^* = 0$ otherwise.
4: else
5:    Find index $i_p$ of the smallest positive element of c.
6:    Find index $i_n$ of the largest non-positive element of c.
7:    if $c_{i_p} > c_{i_n}$ then
8:      Return $z^*$ where $z_i^* = 1$ if $c_i > 0$, $z_{i_n}^* = 1$, and $z_i^* = 0$ otherwise.
9:    else
10:     Return $z^*$ where $z_i^* = 1$ if $c_i > 0$ and $i \neq i_p$, $z_{i_p}^* = 0$, and $z_i^* = 0$ for all other i.
11:   end if
12: end if

REFERENCES

These references are incorporated in their entireties by reference.

[1] R. W. Hamming, "Error detecting and error correcting codes," Bell Syst. Tech. J., vol. 29, no. 2, pp. 147-160, 1950.

[2] J. Feldman, Decoding Error-Correcting Codes via Linear Programming. PhD thesis, Mass. Instit. of Tech., 2003.

[3] J. Feldman, M. J. Wainwright, and D. Karger, "Using linear programming to decoding binary linear codes," IEEE Trans. Inform. Theory, vol. 51, pp. 954-972, March 2005.

[4] P. O. Vontobel and R. Koetter, "On the relationship between linear programming decoding and min-sum algorithm decoding," in IEEE Int. Symp. Inform. Theory and Apps., (Parma, Italy), October 2004.

[5] P. O. Vontobel and R. Koetter, "On low-complexity linear-programming decoding of LDPC codes," *European transactions on telecommunications*, vol. 18, no. 5, pp. 509-517, 2007.

[6] M.-H. N. Taghavi and P. H. Siegel, "Adaptive methods for linear programming decoding," *IEEE Trans. Inform. Theory*, vol. 54, pp. 5396-5410, December 2008.

[7] Y. Wang, J. S. Yedidia, and S. C. Draper, "Multi-stage decoding of LDPC codes," in *Proc. Int. Symp. Inform. Theory*, (Seoul, South Korea), July 2009.

[8] J. Feldman, T. Malkin, R. A. Servedio, C. Stein, and M. J. Wainwright, "LP decoding corrects a constant fraction of errors," in *Proc. Int. Symp. Inform. Theory*, (Chicago, Ill.), June 2004.

[9] C. Daskalakis, A. G. Dimakis, R. M. Karp, and M. J. Wainwright, "Probabilistic analysis of linear programming decoding," *IEEE Trans. Inform. Theory*, vol. 54, pp. 3365-3578, August 2008.

[10] A. Arora, D. Steuer, and C. Daskalakis, "Message-passing algorithms and improved LP decoding," in *ACM Symposium on Theory of Computing (STOC)*, May 2009.

[11] B. J. Frey, R. Koetter, and A. Vardy, "Signal-space characterization of iterative decoding," *IEEE Trans. Inform. Theory*, vol. 47, pp. 766-781, February 2001.

[12] R. Koetter and P. O. Vontobel, "Graph-covers and iterative decoding of finite length codes," in *Proc. Int. Symp. Turbo Codes and Related Topics*, (Brest, France), 2003.

[13] D. J. C. MacKay and M. S. Postol, "Weaknesses of Margulis and Ramanujan-Margulis low-density parity-check codes," *Electronic Notes in Theoretical Computer Science*, vol. 74, no. 0, pp. 97-104, 2003.

[14] T. Richardson, "Error floors of LDPC codes," in *Proc. Allerton Conf. on Communication, Control and Computing*, (Monticello, Ill.), October 2003.

[15] L. Dolecek, P. Lee, Z. Zhang, V. Anatharam, B. Nikolic, and M. J. Wainwright, "Predicting error floors of structured LDPC codes: deterministic bounds and estimates," *IEEE J. Select. Areas Commun.*, vol. 27, pp. 908-917, August 2009.

[16] X.-Y. Hu, E. Eleftheriou, and D. M. Arnold, "Regular and irregular progressive edge-growth Tanner graphs," *IEEE Trans. Inform. Theory*, pp. 386-398, January 2005.

[17] T. Tian, C. Jones, J. D. Villasenor, and R. D. Wesel, "Construction of irregular LDPC codes with low error floors," in *Proc. Int. Conf. Commun.*, (Anchorage, Ak.), pp. 3125-3129, May 2003.

[18] Y. Wang, S. C. Draper, and J. S. Yedidia, "Hierarchical and high-girth QC LDPC codes," *archive preprint* 1111.0711, 2011, submitted to *IEEE Trans. Inform. Theory*.

[19] J. Zhang, J. S. Yedidia, and M. P. C. Fossorier, "Low-latency decoding of EG LDPC codes," *Journal of Lightwave Technology*, vol. 25, pp. 2879-2886, September 2007.

[20] R. M. Tanner, "A recursive approach to low complexity codes," *IEEE Trans. Inform. Theory*, vol. 27, pp. 533-547, September 1981.

[21] Y. Wang and M. Fossorier, "Doubly generalized LDPC codes," in *Proc. Int. Symp. Inform. Theory*, (Seattle, Wash.), pp. 669673, July 2006.

[22] J. S. Yedidia, Y. Wang, and S. C. Draper, "Divide and concur and difference-map BP decoders for LDPC codes," *IEEE Trans. Inform. Theory*, vol. 57, no. 2, pp. 786-802, 2011.

[23] K. Yang, J. Feldman, and X. Wang, "Nonlinear programming approaches to decoding low-density parity-check codes," *IEEE J. Select. Areas Commun.*, vol. 24, pp. 1603-1613, August 2006.

[24] S. C. Draper, J. S. Yedidia, and Y. Wang, "ML decoding via mixed-integer adaptive linear programming decoding," in *Proc. Int. Symp. Inform. Theory*, (Nice, France), July 2007.

[25] S. Boyd, N. Parikh, E. Chu, B. Peleato, and J. Eckstein, "Distributed optimization and statistical learning via the alternating direction method of multipliers," *Machine Learning*, vol. 3, no. 1, pp. 1-123, 2010.

[26] M. V. Afonso, J. M. Bioucas-Dias, and M. A. T. Figueiredo, "An augmented Lagrangian approach to the constrained optimization formulation of imaging inverse problems," *IEEE Transactions on Image Processing*, vol. 20, no. 3, pp. 681695, 2011.

[27] A. F. T. Martins, M. A. T. Figueiredo, P. M. Q. Aguiar, N. A. Smith, and E. P. Xing, "An augmented Lagrangian approach to constrained MAP inference," in *Proceedings of the International Conference on Machine Learning*, 2011.

[28] P. O. Vontobel and R. Koetter, "Towards low-complexity linear-programming decoding," in *Proc. Int. Symp. Turbo Codes and Related Topics*, (Munich, Germany), April 2006.

[29] D. Burshtein, "Linear complexity approximate LP decoding of LDPC codes: generalizations and improvements," in *Proc. Int. Symp. Turbo Codes and Related Topics*, (Lausanne, Switzerland), September 2008.

[30] D. Burshtein, "Iterative approximate linear programming decoding of LDPC codes with linear complexity," *IEEE Trans. Inform. Theory*, vol. 55, no. 11, pp. 4835-4859, 2009.

[31] P. Vontobel, "Interior-point algorithms for linear-programming decoding," in *UCSD Workshop Inform. Theory Apps.*, (San Diego, Calif.), January 2008.

[32] T. Wadayama, "Interior point decoding for linear vector channels based on convex optimization," in *Proc. Int. Symp. Inform. Theory*, (Toronto, CA), pp. 1493-1497, July 2008.

[33] T. Wadayama, "An LP decoding algorithm based on primal path-following interior point method," in *Proc. Int. Symp. Inform. Theory*, (Seoul, Korea), pp. 389-393, July 2009.

[34] M.-H. N. Taghavi, A. Shokrollahi, and P. H. Siegel, "Efficient implementation of linear programming decoding," *IEEE Trans. Inform. Theory*, vol. 55, pp. 5960-5982, September 2010.

[35] H. Liu, W. Qu, B. Liu, and J. Chen, "On the decomposition method for linear programming decoding of LDPC codes," *IEEE Trans. Commun.*, vol. 58, pp. 3448-3458, December 2010.

[36] R. G. Jeroslow, "On defining sets of vertices of the hypercube by linear inequalities," *Discrete Mathematics*, vol. 11, no. 2, pp. 119-124, 1975.

[37] M. Yannakakis, "Expressing combinatorial optimization problems by linear programs," *Journal of Computer and System Sciences*, vol. 43, no. 3, pp. 441-466, 1991.

[38] D. P. Bertsekas, A. Nedic, and A. E. Ozdaglar, *Convex Analysis and Optimization*. Belmont, Mass.: Athena Scientific, 2003.

[39] J. Nocedal and S. J. Wright, *Numerical Optimization*. Springer, 2nd ed., 2006.

[40] J. S. Yedidia, "The alternating direction method of multipliers as a message-passing algorithms." Talk delivered at the Princeton Workshop on Counting, Inference and Optimization, October 2011.

[41] G. D. Formey, "Codes on graphs: normal realizations," *IEEE Trans. Inform. Theory*, vol. 47, pp. 520-548, February 2001.

[42] F. R. Kschischang, B. J. Frey, and H. Loeliger, "Factor graphs and the sum-product algorithm," *IEEE Trans. Inform. Theory*, vol. 47, pp. 498-519, February 2001.

[43] H.-A. Loeliger, "An introduction to factor graphs," *IEEE Signal Proc. Mag.*, vol. 21, pp. 28-41, January 2004.

[44] A. Marshall, I. Olkin, and A. B. C., *Inequalities: theory of majorization and its applications*. Springer, 2009.

[45] S. Barman, X. Liu, S. C. Draper, and B. H. Recht, "Decomposition methods for large-scale linear-programming decoding," in *Proc. Allerton Conf. on Communication, Control and Computing*, (Monticello, Ill.), September 2011.

We claim:

1. An error correction electronic circuit comprising:
a buffer memory for holding a received string of bits from a transmitted string of bits subject to a probability of transmission error;
a parity rule memory holding a set of parity rules for the transmitted string of bits, each parity rule describing a relationship between a subset of the transmitted string of bits; and
a linear programming optimizer communicating with the buffer memory and parity rule memory to generate a corrected string of bits from the received string of bits using a linear programming process configured to maximize a probability that the corrected string of bits represents the transmitted string of bits, subject to the set of parity rules for the transmitted string of bits;
wherein the linear programming optimizer iteratively repeats two steps, a first step adjusting values of the corrected string of bits based on iteratively changing replicas and a second step updating the iteratively changing replicas based upon their deviation from actual parity rules.

2. The error correction circuit of claim 1 wherein the first step of adjusting values of the corrected string of bits adjusts each bit of the corrected string of bits as a function of the iteratively changing replicas independent of the value of the other bits of the corrected string of bits.

3. The error correction circuit of claim 1 wherein the error correction electronic circuit provides multiple independently executing computational elements associated with different replicas to adjust the different replicas in parallel.

4. The error correction circuit of claim 1 wherein the error correction electronic circuit provides multiple independently executing computational elements associated with different values of the corrected string of bits to adjust the different values of the corrected string of bits in parallel.

5. The error correction circuit of claim 1 wherein the second step of updating the iteratively changing replicas defines a projection of the iteratively changing replicas to a parity polytope being a convex hull whose vertices are defined by the parity rules.

6. The error correction circuit of claim 1 wherein the first step and second step implement an alternating direction method of multipliers.

7. The error correction circuit of claim 1 wherein a maximized probability generated by the linear programming optimizer models a binary symmetric channel.

8. The error correction circuit of claim 1 wherein the parity rules provide a low density parity cheek taking as arguments a small subset of bits of the transmitted string of bits.

9. The error correction electronic circuit of claim 1 wherein the parity rules provide for even parity for a subset of bits of the transmitted string of bits.

10. A method of performing error correction on a string of binary bits subject to a probability of transmission error using an electronic circuit comprising:
receiving into a memory a string of bits;
storing a set of parity rules for the string of bits received into memory, each parity rule describing a relationship between a subset of the string of bits; and
generating a corrected string of bits from the received string of bits using linear programming minimizing a probability that the corrected string of bits erroneously represents the received string of bits, subject to the set of parity rules for the string of bits, the linear programming divided into individually parallelizable tasks executed simultaneously on multiple circuit components;
wherein the linear programming iteratively, repeats two steps, a first step adjusting values of the corrected string of bits based on an iteratively changing replicas and a second step updating the iteratively changing replicas based upon their deviation from actual parity rules.

11. The method of claim 10 wherein the first step of adjusting values of the corrected string of bits adjusts each bit of the corrected string of bits as a function of the iteratively changing replicas independent of the value of the other bits of the corrected string of bits.

12. The method of claim 10 wherein the electronic circuit adjusts different replicas in parallel.

13. The method of claim 10 wherein the electronic circuit adjusts different values of the corrected string of bits in parallel.

14. The method of claim 11 wherein the second step of updating the iteratively changing replicas finds a projection of the iteratively changing replicas to a parity polytope being a convex hull whose vertices are defined by the set of parity rules.

15. The method of claim 10 wherein the first step and second step implement an alternating direction method of multipliers.

16. The method of claim 10 wherein the linear programming models a binary symmetric channel.

17. The method of claim 10 wherein, the set of parity rules provide a low density parity check taking as arguments a small subset of the set of bits of the string of bits.

18. The method of claim 10 wherein the set of parity rules provide for even parity for a subset of bits of the string of bits.

* * * * *